US009508441B1

(12) United States Patent
Nam et al.

(10) Patent No.: US 9,508,441 B1
(45) Date of Patent: Nov. 29, 2016

(54) MEMORY DEVICE AND MEMORY SYSTEM

(71) Applicant: SAMSUNG ELECTRONICS CO., LTD., Suwon-Si, Gyeonggi-Do (KR)

(72) Inventors: Sang-Wan Nam, Hwaseong-Si (KR); Dae-Seok Byeon, Seongnam-Si (KR); Chi-Weon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/131,237

(22) Filed: Apr. 18, 2016

(30) Foreign Application Priority Data

Jul. 7, 2015 (KR) .................. 10-2015-0096787

(51) Int. Cl.
G11C 16/04 (2006.01)
G11C 16/10 (2006.01)
G11C 16/08 (2006.01)

(52) U.S. Cl.
CPC ........... G11C 16/10 (2013.01); G11C 16/0483 (2013.01); G11C 16/08 (2013.01)

(58) Field of Classification Search
CPC ..................................... G11C 16/04
USPC ....................... 365/185.01–185.33
See application file for complete search history.

(56) References Cited

U.S. PATENT DOCUMENTS

| 7,009,888 | B2 | 3/2006 | Masuoka et al. |
| 7,876,619 | B2 | 1/2011 | Takeda et al. |
| 8,320,184 | B2 | 11/2012 | Yang et al. |
| 8,385,122 | B2* | 2/2013 | Kim .................. G11C 16/0483 257/315 |
| 8,488,381 | B2 | 7/2013 | Kim et al. |
| 8,599,614 | B2 | 12/2013 | Miida et al. |
| 8,638,608 | B2 | 1/2014 | Lai et al. |
| 8,823,078 | B2* | 9/2014 | Kim .................. G11C 16/0483 257/316 |
| 8,982,632 | B2 | 3/2015 | Ogawa |
| 2010/0177566 | A1* | 7/2010 | Kim .................. G11C 16/0483 365/185.17 |
| 2013/0161727 | A1* | 6/2013 | Kim .................. G11C 16/0483 257/324 |
| 2013/0242675 | A1 | 9/2013 | Kwak et al. |
| 2014/0043896 | A1 | 2/2014 | Park et al. |
| 2014/0334232 | A1 | 11/2014 | Nam et al. |

FOREIGN PATENT DOCUMENTS

KR 10-1036300 5/2011
KR 10-2014-0133268 A 11/2014

* cited by examiner

Primary Examiner — Harry W Byrne
(74) Attorney, Agent, or Firm — Volentine & Whitt, PLLC

(57) ABSTRACT

A memory device includes a memory cell array including a plurality of NAND strings, wherein each of the NAND strings includes a ground selection transistor connected to a ground selection line, memory cells connected to word lines, and a string selection transistor connected to a string selection line, wherein the ground selection line, the word lines, and the string selection line are vertically stacked on a substrate. A control logic adjusts a ground selection line voltage applied to the ground selection line or a string selection line voltage applied to the string selection line to a negative level in at least a portion of a program section during which a program operation related to a memory cell selected from among the memory cells is performed.

20 Claims, 48 Drawing Sheets

MEMORY DEVICE AND MEMORY SYSTEM

CROSS-REFERENCE TO RELATED APPLICATION

This application claims the benefit of Korean Patent Application No. 10-2015-0096787, filed on Jul. 7, 2015, in the Korean Intellectual Property Office, the disclosure of which is incorporated herein in its entirety by reference.

BACKGROUND

The inventive concept relates to a memory device, and more particularly, to a memory device including a 3-dimensional (3D) memory array and a memory system.

Memory devices for storing data may be classified into volatile memory devices and non-volatile memory devices. Non-volatile memory devices, i.e., flash memory devices, may be used, for example, in mobile phones, digital cameras, personal digital assistants (PDAs), portable computing devices, stationary computing devices, and other devices.

SUMMARY

According to an aspect of the inventive concept, there is provided a memory device including a memory cell array including a plurality of NAND strings, wherein each of the NAND strings includes a ground selection transistor connected to a ground selection line, memory cells connected to word lines, and a string selection transistor connected to a string selection line, wherein the ground selection line, the word lines, and the string selection line are vertically stacked on a substrate, and a control logic that adjusts a ground selection line voltage applied to the ground selection line or a string selection line voltage applied to the string selection line to a negative level in at least a portion of a program section during which a program operation related to a memory cell selected from among the memory cells is performed.

According to another aspect of the inventive concept, there is provided a memory device including a memory cell array including a plurality of NAND strings, wherein each of the NAND strings includes a ground selection transistor, a plurality of memory cells, and a string selection transistor vertically stacked on a substrate, and a row decoder connected to the memory cell array via a ground selection line, word lines, and a string selection line, and including a word line pass transistor located in a first well and a ground selection line pass transistor and a string selection line pass transistor located in a second well.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
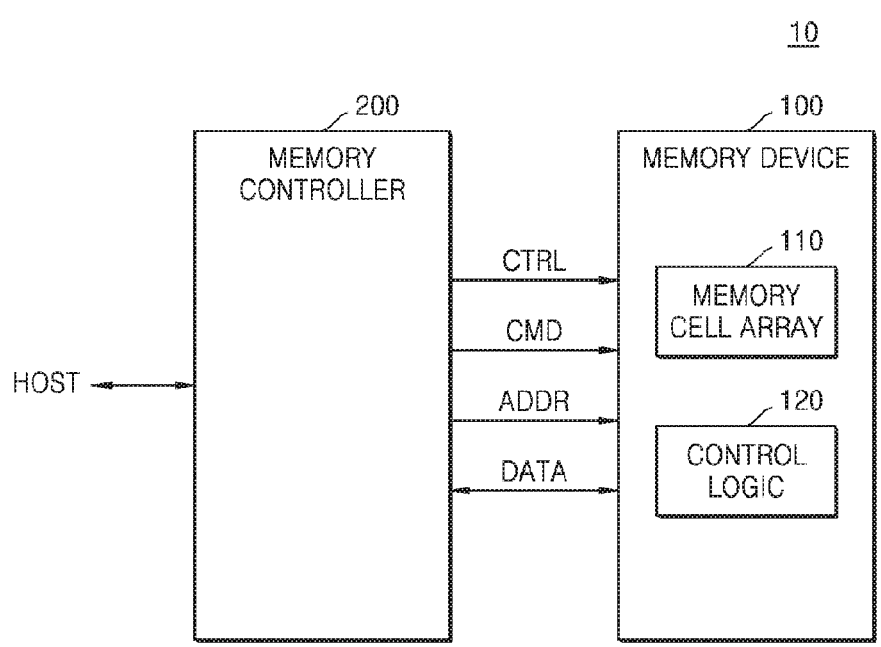
FIG. 1 is a block diagram of a memory system, according to an exemplary embodiment.

Hereinafter, the inventive concept will be described with reference to the accompanying drawings, in which exemplary embodiments of the inventive concept are shown. The exemplary embodiments are provided so that this disclosure will be through and complete, and will fully convey the inventive concept to those of ordinary skill in the art. As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope are encompassed in the inventive concept. Like reference numerals refer to like elements. Structures or sizes of components in the drawings may be exaggerated for convenience of description and clarity.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components must not be limited to the above terms. The above terms are used only to distinguish one component from another. For example, within the scope of the present inventive concept, a first component may be referred to as a second component, and vice versa.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless defined otherwise, all terms used in the description including technical or scientific terms have the same meaning as commonly understood by one of ordinary skill in the art to which the present inventive concept pertains. It will be further understood that terms, such as those defined in commonly used dictionaries, should be interpreted as having a meaning that is consistent with their meaning in the context of the related art, and should not be interpreted as having ideal or excessively formal meanings unless it is clearly defined in the specification.

As used herein, the term "and/or" includes any and all combinations of one or more of the associated listed items. Expressions such as at least one of when preceding a list of elements, modify the entire list of elements and do not modify the individual elements of the list.

FIG. 1 is a schematic block diagram of a memory system 10, according to an exemplary embodiment.

Referring to FIG. 1, the memory system 10 may include a memory device 100 and a memory controller 200. The memory device 100 may include a memory cell array 110 and control logic 120.

The memory cell array 110 may include a plurality of memory cells. For example, the plurality of memory cells may be flash memory cells. Hereinafter, the exemplary embodiments will be described assuming that the plurality of memory cells are NAND flash memory cells. However, the exemplary embodiments are not limited thereto. In other exemplary embodiments, the plurality of memory cells may be resistive memory cells such as resistive RAM (RRAM), phase change RAM (PRAM), or magnetic RAM (MRAM).

According to an exemplary embodiment of the present inventive concept, the memory cell array 110 may be a 3-dimensional (3D) memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. Also, U.S. Patent Publication No. 2014-0334232 and U.S. Pat. No. 8,488,381 are applied to the present specification as references.

According to the present exemplary embodiment, the memory cell array 110 may include a plurality of NAND strings, and each of the NAND strings may include a ground selection transistor connected to ground selection lines, word lines, and string selection lines, a plurality of memory cells, and a string selection transistor, which are vertically stacked on a substrate. According to the present exemplary embodiment, in at least a portion of a program section during which a program operation related to a memory cell selected from the memory cells of the memory cell array 110 is performed, the control logic 120 may adjust a ground selection line voltage applied to the ground selection lines or a string selection line voltage applied to the string selection lines to a negative level. According to an exemplary embodiment, in at least a portion of a read section during which a read operation related to a memory cell selected from the memory cells of the memory cell array 110 is performed, the control logic 120 may adjust the ground selection line voltage or the string selection line voltage to a negative level.

The memory controller 200 may control the memory device 100 to read data stored in the memory device 100 or write data to the memory device 100 in response to a read/write request from a HOST. In particular, the memory controller 200 may control program (or write), read, and erase operations with regard to the memory device 100 by providing an address ADDR, a command CMD, and a control signal CTRL to the memory device 100. Also, DATA for the program operation and read DATA may be transmitted and received between the memory controller 200 and the memory device 100.

Although not illustrated, the memory controller 200 may include a RAM, a processing unit, a host interface, and a memory interface. The RAM may function as an operation memory of the processing unit. The processing unit may control operations of the memory controller 200. The host interface may include a protocol for exchanging data between a host and the memory controller 200. For example, the memory controller 200 may be configured to communicate with an external host by using at least one interface protocol such as Universal Serial Bus (USB), Multimedia Card (MMC), Peripheral Component Interconnect Express (PCI-E), Advanced Technology Attachment (ATA), Serial-ATA, Parallel-ATA, Small Computer System Interface (SCSI), Enhanced Small Disk Interface (ESDI), and Integrated Drive Electronics (IDE).

Figure 2:
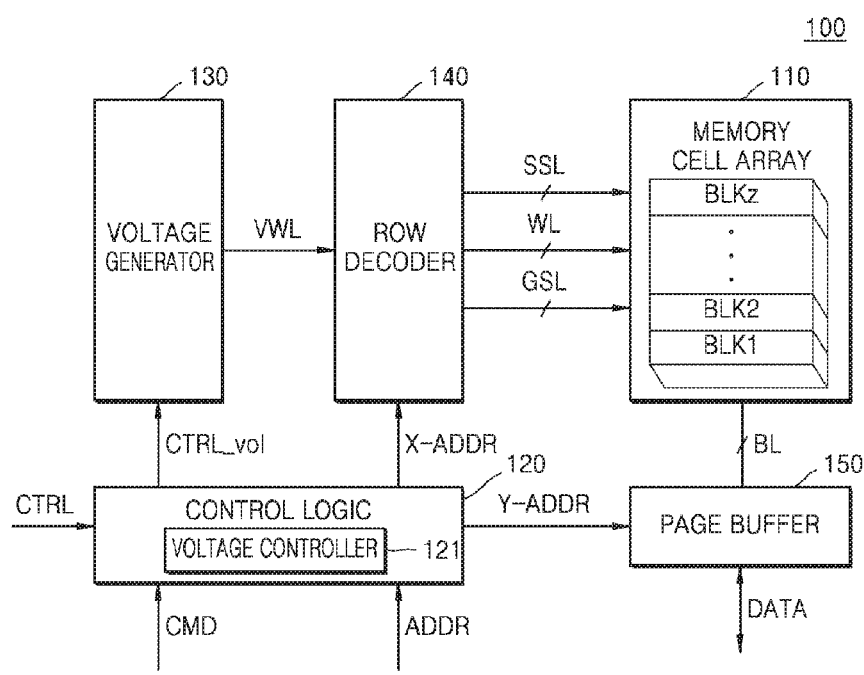
FIG. 2 is a detailed block diagram of a memory device of FIG. 1.

FIG. 2 is a detailed block diagram of the memory device 100 of FIG. 1.

Referring to FIG. 2, the memory device 100 may include the memory cell array 110, the control logic 120, a voltage generator 130, a row decoder 140, and a page buffer 150. Although not illustrated, the memory device 100 may further include a data input/output (I/O) circuit or an I/O interface.

The memory cell array 110 may include the plurality of memory cells and be connected to word lines WL, string selection lines SSL, ground selection lines GSL, and bit lines BL. In an exemplary embodiment, the memory cell array 110 may be connected to the row decoder 140 via the word lines WL, the string selection lines SSL, and the ground selection lines GSL, and connected to the page buffer 150 via the bit lines BL.

The memory cell array 110 may include a plurality of blocks BLK1 to BLKz, and each of the blocks BLK1 to BLKz may have a 3D structure (or a vertical structure). In an exemplary embodiment, each of the blocks BLK1 to BLKz has structures that extend in first to third directions. For example, each of the blocks BLK1 to BLKz include a plurality of NAND strings (hereinafter, referred to as 'strings') that extend in the third direction. The strings may be spaced apart by a certain distance in the first and second directions. The blocks BLK1 to BLKz may be selected by the row decoder 140. For example, the row decoder 140 may select a block that corresponds to a block address from among the blocks BLK1 to BLKz.

The memory cell array 110 may include at least one of a single level cell block including single level cells, a multi-level cell block including multi-level cells, and a triple level cell block including triple level cells. In other words, some blocks in the blocks BLK1 to BLKz included in the memory cell array 110 may be single level cell blocks, and other blocks may be multi-level cell blocks or triple level cell blocks.

Based on the command CMD, the address ADDR, and the control signal CTRL received from the memory controller 200, the control logic 120 may output control signals for writing data to the memory cell array 110 or reading data from the memory cell array 110. Accordingly, the control logic 120 may control overall operations in the memory device 100.

The controls signals that are output from the control logic 120 may be applied to the voltage generator 130, the row decoder 140, and the page buffer 150. In an exemplary embodiment, the control logic 120 may apply a voltage control signal CTRL_vol to the voltage generator 130, a row address X-ADDR to the row decoder 140, and a column address Y-ADDR to the page buffer 150. However, the exemplary embodiments are not limited thereto. The control logic 120 may apply other control signals to the voltage generator 130, the row decoder 140, and the page buffer 150.

According to the present exemplary embodiment, the control logic 120 may include a voltage controller 121. The voltage controller 121 may generate the voltage control signal CTRL_vol for generating a word line voltage for driving the word lines WL, a string selection line voltage for driving the string selection lines SSL, and a ground selection line voltage for driving the ground selection lines GSL.

According to an exemplary embodiment, the voltage controller 121 may generate the voltage control signal CTRL_vol such that a string selection line voltage, which is applied to a non-selected string selection line that is connected to a non-selected memory cell, has a negative level in a program section. According to an exemplary embodiment, the voltage controller 121 may generate the voltage control signal CTRL_vol such that the string selection line voltage has a negative level in at least a portion of the program section.

According to an exemplary embodiment, the voltage controller 121 may generate the voltage control signal CTRL_vol such that a ground selection line voltage, which is applied to a non-selected ground selection line that is connected to a non-selected memory cell, has a negative level in the program section. According to an exemplary embodiment, the voltage controller 121 may generate the voltage control signal CTRL_vol such that the ground selection line voltage has a negative level in at least a portion of the program section.

According to an exemplary embodiment, the voltage controller 121 may generate the voltage control signal CTRL_vol such that a string selection line voltage, which is applied to a non-selected string selection line that is connected to a non-selected memory cell, has a negative level in a read section. According to an exemplary embodiment, the voltage controller 121 may generate the voltage control signal CTRL_vol such that the string selection line voltage has a negative level in at least a portion of the read section.

According to an exemplary embodiment, the voltage controller 121 may generate the voltage control signal CTRL_vol such that a ground selection line voltage, which is applied to a non-selected ground selection line that is connected to a non-selected memory cell, has a negative level in a read section. According to an exemplary embodiment, the voltage controller 121 may generate the voltage control signal CTRL_vol such that the ground selection line voltage has a negative level in at least a portion of the read section.

According to an exemplary embodiment, each of the NAND strings may include a plurality of string selection transistors, and accordingly, may be connected to the row decoder 140 via the string selection lines. In this case, the voltage controller 121 may generate the voltage control signal CTRL_vol such that a string selection line voltage, which is applied to at least one of non-selected string selection lines, has a negative level in the program section or the read section.

According to an exemplary embodiment, each of the NAND strings may include a plurality of ground selection line transistors and be connected to the row decoder 140 via the ground selection lines. In this case, the voltage controller 121 may generate the voltage control signal CTRL_vol such that a ground selection line voltage, which is applied to at least one of non-selected ground selection lines, has a negative level in the program section or the read section.

According to an exemplary embodiment, each of the NAND strings may include a plurality of dummy cells and be connected to the row decoder 140 via a plurality of dummy lines. In this case, the voltage controller 121 may generate the voltage control signal CTRL_vol such that a dummy line voltage is changed based on locations and the number of string selection transistors and ground selection transistors.

The voltage generator 130 may generate various types of voltages for performing program, read, and erase operations for the memory cell array 110 based on the voltage control signal CTRL_vol. In an exemplary embodiment, the voltage generator 130 may generate a word line voltage, for example, a program voltage (or a write voltage), a read voltage, a program inhibit voltage, a read inhibit voltage, an erase verification voltage or a program verification voltage. Also, the voltage generator 130 may further generate a string selection line voltage and a ground selection line voltage based on the voltage control signal CTRL_vol. Also, the voltage generator 130 may further generate an erase voltage that is to be applied to the memory cell array 110.

The row decoder 140 may select some of the word lines WL in response to the row address X-ADDR from the control logic 120. In an exemplary embodiment, during a read operation, the row decoder 140 may apply a read voltage to a selected word line, and apply a read inhibit voltage to non-selected word lines. Also, during a program operation, the row decoder 140 may apply a program voltage to a selected word line, and apply a program inhibit voltage to non-selected word lines. Also, the row decoder 140 may select some of the string selection lines SSL and some of the ground selection lines GSL in response to the row address X-ADDR from the control logic 120.

According to the present exemplary embodiment, the row decoder 140 may apply a negative level voltage to a non-selected string selection line and/or non-selected ground selection line in at least a portion of the program section. Accordingly, a string selection transistor connected to the non-selected string selection line and/or a ground selection transistor connected to the non-selected ground selection line may be normally turned off. This may reduce leakage current via the string selection transistor and/or the ground selection transistor. Also, since a boosting voltage may be maintained in a channel area of non-selected strings, program disturb may be reduced or eliminated.

According to an exemplary embodiment, the row decoder 140 may apply a negative level voltage to a non-selected string selection line and/or a non-selected ground selection line in at least a portion of the read section. Accordingly, a string selection transistor connected to the non-selected string selection line and/or a ground selection transistor connected to the non-selected ground selection line may be normally turned off. This reduces leakage current via the string selection transistor and/or the ground selection transistor, and thus, prevents a voltage applied to the bit lines BL for the read operation from leaking via a string of a non-selected block or a non-selected string of a selected block, leading to a reduction in data detection errors.

According to an exemplary embodiment, the row decoder 140 may apply a negative level voltage to a non-selected string selection line and/or non-selected ground selection line in at least a portion of a program verification section or at least a portion of an erase verification section. Accordingly, a string selection transistor connected to the non-selected string selection line and/or a ground selection transistor connected to the non-selected ground selection line may be normally turned off. This may reduce leakage current via the string selection transistor and/or the ground selection transistor, and prevent a voltage applied to the bit lines BL for the read operation from leaking via a string of a non-selected block a non-selected string of a selected block. Thus, data detection errors may be reduced.

The page buffer 150 may be connected to the memory cell array 110 via the bit lines BL, and select some of the bit lines BL in response to the column address Y-ADDR from the control logic 120. In an exemplary embodiment, during a read operation, the page buffer 150 may function as a sense amplifier and sense DATA stored in the memory cell array 110. However, during a program operation, the page buffer 150 may function as a write driver and input DATA to be stored into the memory cell array 110.

Figure 3:
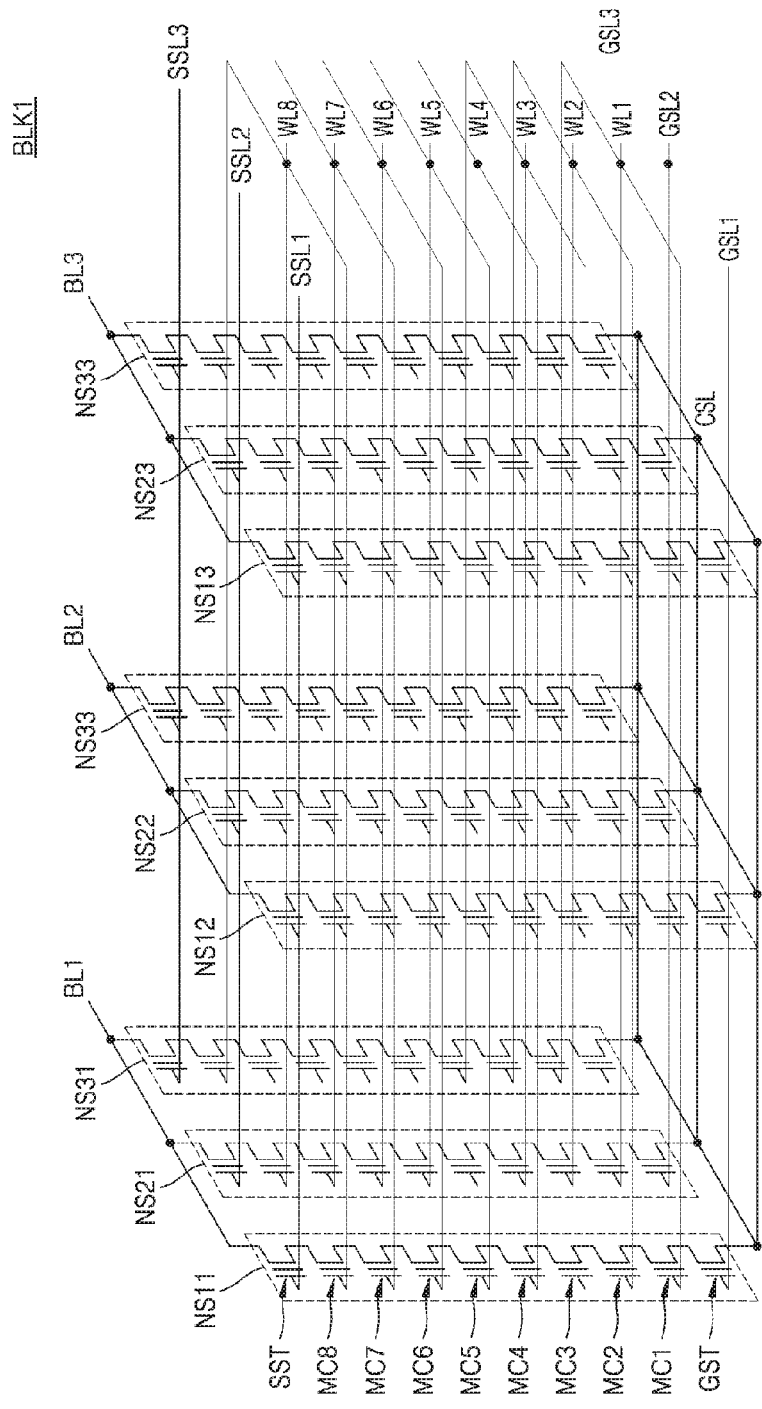
FIG. 3 is a circuit diagram of an equivalent circuit of a first block of FIG. 2.

FIG. 3 is a circuit diagram of an equivalent circuit of a first block BLK1 of FIG. 2.

Referring to FIG. 3, the first block BLK1 may be a NAND flash memory with a vertical structure, and each of the blocks BLK1 to BLKz shown in FIG. 2 may be provided as in FIG. 3. The first block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. The number of NAND strings, the number of word lines, the number of bit lines, the number of ground selection lines, and the number of string selection lines may vary according to exemplary embodiments.

NAND strings NS11, NS21, and NS31 are between a first bit line BL1 and the common source line CSL, NAND strings NS12, NS22, and NS32 are between a second bit line BL2 and the common source line CSL, and NAND strings NS13, NS23, and NS33 are between the third bit line BL3 and the common source line CSL. Each of the NAND strings (e.g., NS11) may include a string selection transistor SST, a plurality of memory cells MC1 to MC8, and a ground selection transistor GST, which are connected in series. Hereinafter, a 'NAND string' will be referred to as 'string' for convenience.

Strings that are commonly connected to a single bit line form a single column. For example, the strings NS11, NS21, and NS31 that are commonly connected to the first bit line BL1 may correspond to a first column, the strings NS12, NS22, and NS32 that are commonly connected to the second bit line BL2 may correspond to a second column, and the strings NS13, NS23, and NS33 that are commonly connected to the third bit line BL3 may correspond to a third column.

Strings that are commonly connected to a single string selection line form a single row. For example, the strings NS11, NS12, and NS13 that are connected to the first string selection line SSL1 may correspond to a first row, the strings NS21, NS22, and NS23 that are connected to the second string selection line SSL2 may correspond to a second row, and the strings NS31, NS32, and NS33 that are connected to the third string selection line SSL3 may correspond to a third row.

The string selection transistor SST is connected to corresponding string selection lines SSL1 to SSL3. The plurality of memory cells MC1 to MC8 are respectively connected to corresponding word lines WL1 to WL8. The ground selection transistor GST is connected to corresponding ground selection lines GSL1 to GSL3. The string selection transistor SST is connected to corresponding bit lines BL1 to BL3, and the ground selection transistor GST is connected to the common source line CSL.

According to the present exemplary embodiment, word lines (e.g., WL1) with an identical height are commonly connected to each other, the string selection lines SSL1 to SSL3 are spaced apart from each other, and the ground selection lines GSL1 to GSL3 are also spaced apart from each other. For example, when programming memory cells that are connected to a first word line WL1 and included in the strings NS11, NS12, and NS13, the first word line WL1 and the first string selection line SSL1 is selected. However, the exemplary embodiments are not limited thereto. According to an exemplary embodiment, the ground selection lines GSL1 to GSL3 may be commonly connected to each other.

Figure 4:
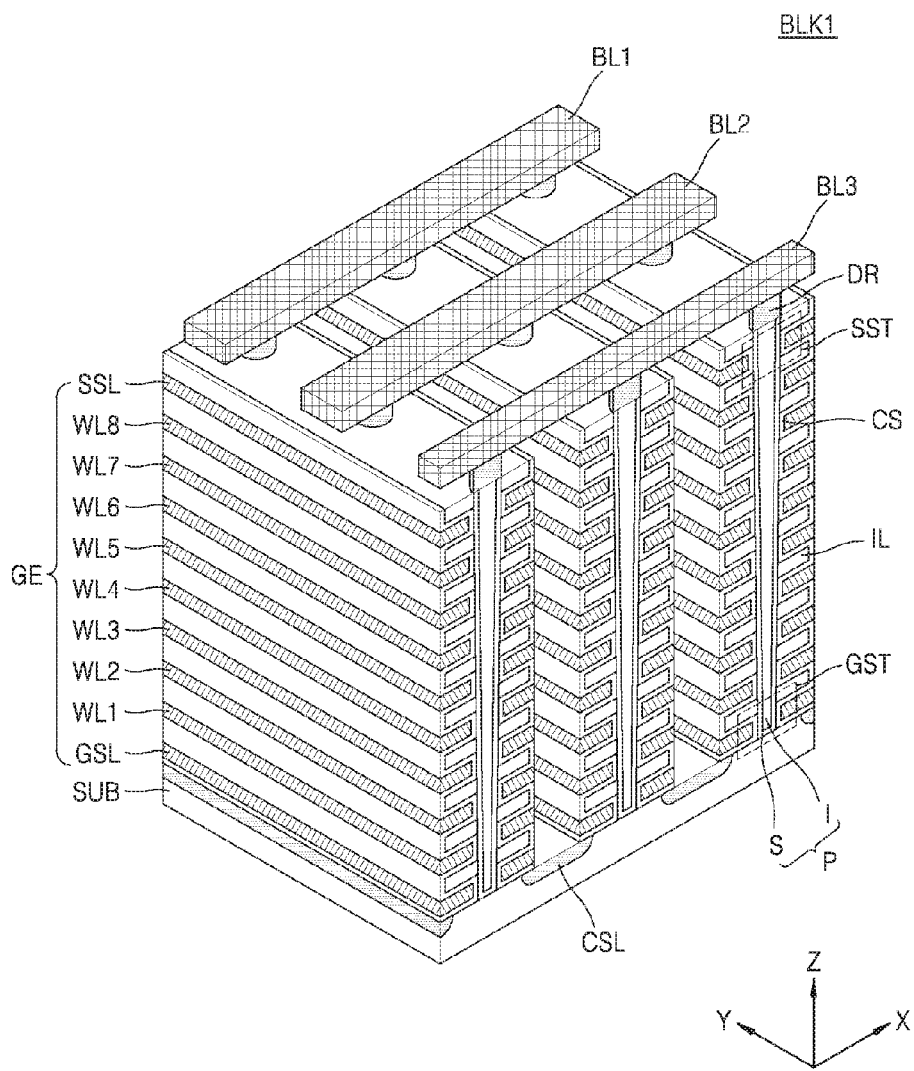
FIG. 4 is a perspective view of an example of a first block from among blocks of FIG. 2.

FIG. 4 is a perspective view of an example of the first block BLK1 from among blocks of FIG. 2.

Referring to FIG. 4, the first block BLK1 is formed in a vertical direction with respect to a substrate SUB. Although FIG. 4 illustrates that the first block BLK1 includes two selections lines (GSL, SSL), eight word lines (WL1 to WL8), and three bit lines (BL1 to BL3), the number of each of the lines may be more or less than those shown.

The substrate SUB is a first conductive type (e.g., p-type). Common source lines CSL extends in a first direction (e.g., Y direction) on the substrate SUB and is doped with second conductive type (e.g., n-type) impurities. A plurality of insulating layers IL extending in the first direction are sequentially provided in a third direction (e.g., Z direction) on an area of the substrate SUB between two adjacent common source lines CSL. The plurality of insulating layers IL are spaced apart by a certain distance in the third direction. For example, the plurality of insulating layers IL may include an insulating material such as silicon oxide.

A plurality of pillars P are sequentially provided in the first direction provided on an area of the substrate SUB between two adjacent common source lines CSL. The pillars P penetrate through the plurality of insulating layers IL in the third direction. For example, the plurality of pillars P may penetrate through the plurality of insulating layers IL and contact the substrate SUB. In an exemplary embodiment, a surface layer S of each of the pillars P may include a first type silicon material and function as a channel area. An inner layer I of each of the pillars P may include an insulating material such as silicon oxide or an air gap.

A charge storage layer CS may be provided on a region between two adjacent common source lines CSL along exposed surfaces of the insulating layers IL, the pillars P, and the substrate SUB. The charge storage layer CS may include a gate insulating layer (or referred to as 'tunneling insulating layer'), a charge trap layer, and a blocking insulating layer. For example, the charge storage layer CS may have an oxide-nitride-oxide (ONO) structure. Also, on an area of the substrate SUB between two adjacent common source lines CSL, a gate electrode GE including the selection lines (GSL, SSL) and the word lines WL1 to WL8 are provided on an exposed surface of the charge storage layer CS.

Drains or drains contacts DR are provided on each of the plurality of pillars P. For example, the drains or drain contacts DR may include a silicon material that is doped with second conductive type impurities. On the drains DR, bit lines BL1 to BL3 extend in the second direction (e.g., X direction) and are spaced apart by a certain distance in the first direction.

According to the present exemplary embodiment, since the string selection transistor SST connected to the string selection line SSL and the ground selection transistor GST connected to the ground selection line GSL are formed in a vertical direction with respect to the substrate SUB, targeting of a threshold voltage may not be easy during a manufacturing process. Also, since the string selection transistor SST and the ground selection transistor GST (hereinafter, referred to as 'selection transistor') use, for example, a surface layer S formed with polysilicon as a channel area, the selection transistor may be vulnerable to leakage current via grain boundaries. Furthermore, an interface between the surface layer S formed with polysilicon and the gate insulating layer included in the charge storage layer CS may have more interface traps than an interface between a channel layer grown on a monocrystal silicon layer and the gate insulating layer, and thus, it may not be possible to normally turn on/off the selection transistors.

Figure 5:
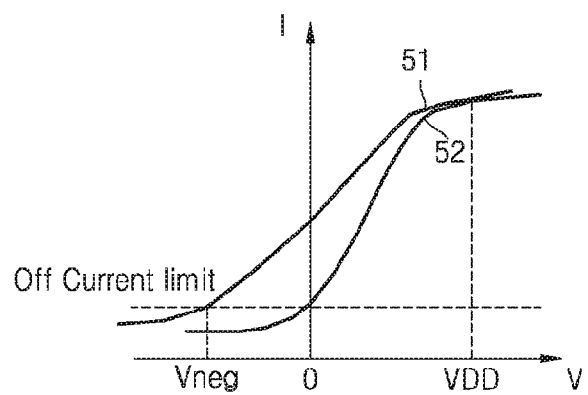
FIG. 5 is a graph of a current-voltage characteristic curve of a selection transistor.

FIG. 5 is a graph of a current-voltage characteristic curve of the selection transistor.

Referring to FIG. 5, a horizontal axis represents voltage and a vertical axis represents current. In FIG. 5, a current-voltage characteristic curve of the selection transistor 51 in the 3D memory device according to the present exemplary embodiment, and a current-voltage characteristic curve of a selection transistor 52 in a 2-dimensional (2D) memory device are illustrated.

Referring to FIGS. 4 and 5, since the selection transistor 51 in the 3D memory device is a cell transistor including a charge trap layer, a field formed by a voltage applied to the gate electrode GE is affected by charges trapped in the charge trap layer and thus affects the surface layer S that is a channel area. Accordingly, a sub-threshold swing of the selection transistor 51 in the 3D memory device may be substantially greater than the selection transistor 52 in the 2D memory device. This may cause difficulty in controlling current caused by a gate voltage of the selection transistor 51, and thus, a greater voltage range may be required when turning on/off the selection transistor 51.

In an exemplary embodiment, a turn-off voltage for turning off the selection transistor 52 of the 2D memory device may be a ground voltage GND, and a turn-on voltage for turning on the selection transistor 52 may be a power voltage VDD. When the turn-off voltage, i.e., the ground voltage GND, is applied to a gate of the selection transistor 52, current flowing in the selection transistor 52 (hereinafter, referred to as 'off current') may be the same as or lower than an off current limit. In this case, since the sub-threshold swing of the selection transistor 52 is relatively small, a difference between the turn-on voltage and the turn-off voltage of the selection transistor 52 may be relatively small.

However, since the sub-threshold swing of the selection transistor 51 of the 3D memory device is relatively large, a difference between a turn-on voltage and a turn-off voltage of the selection transistor 51 may be relatively large. Therefore, when the turn-on voltage and the turn-off voltage applied to the selection transistor 52 of the 2D memory device are applied to a gate of the selection transistor 51 of the 3D memory device, the selection transistor 51 may not be normally turned on/off.

FIG. 5 illustrates a current-voltage characteristic of the selection transistor 51 when the turn-on voltage of the selection transistor 52 of the 2D memory device, i.e., the power voltage VDD, is used as the turn-on voltage of the selection transistor 51 of the 3D memory device. When the ground voltage GND is used as the turn-off voltage of the selection transistor 51 of the 3D memory device, the current flowing in the selection transistor 51 (i.e., off current) may be substantially greater than the off current limit. Due to this, the selection transistor 51 may not be turned off and thus program disturb may occur. However, when the power voltage VDD is used as the turn-on voltage of the selection transistor 51, the selection transistor 51 may not be turned on and thus the memory cell may not be programmed.

Therefore, according to the present exemplary embodiment, to adjust and make the off current of the selection transistor 51 of the 3D memory device be the same as or lower than the off current limit, a negative voltage Vneg may be applied as the turn-off voltage of the selection transistor 51. Since a voltage difference between the negative voltage Vneg and the power voltage VDD is large, the selection transistor 51 having a large sub-threshold swing may be normally turned on/off.

Figure 6:
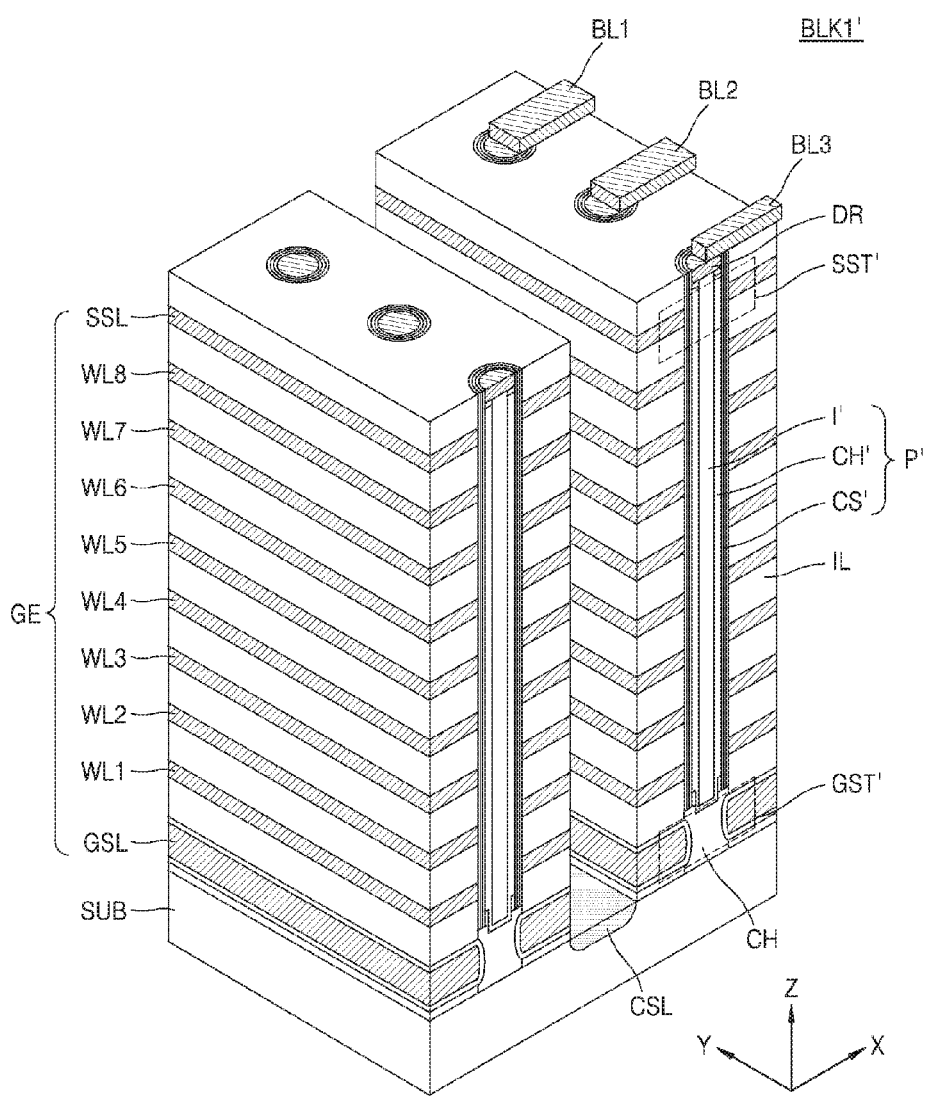
FIG. 6 is a perspective view of another example of the first block from among the blocks of FIG. 2.

FIG. 6 is a perspective view of another example of a first block from among the blocks of FIG. 2.

Referring to FIG. 6, a first block BLK1' is formed in a vertical direction with respect to a substrate SUB. Although FIG. 6 illustrates that the first block BLK1' includes two selections lines (GSL, SSL), eight word lines (WL1 to WL8), and three bit lines (BL1 to BL3), the number of each of the lines may be more or less than that shown in the drawing.

The substrate SUB is a first conductive type (e.g., p-type). A common source line CSL extends in a first direction (e.g., Y direction) on the substrate SUB and is doped with second conductive type (e.g., n type) impurities. Also, a plurality of insulating layers IL extending in the first direction are sequentially provided in a third direction (e.g., Z direction) on an area of the substrate SUB near the common source line CSL. The plurality of insulating layers IL are spaced apart by a certain distance in the third direction. For example, the plurality of insulating layers IL may include an insulating material such as silicon oxide. Also, a plurality of gate electrodes GE, which includes the selections lines (GSL, SSL) and the word lines WL1 to WL8 extending in the first direction, and the plurality of insulating layers IL may be alternately stacked.

A plurality of pillars P' are sequentially provided in the first direction on an area of the substrate SUB near the common source line CSL. The plurality of pillars P' penetrate through the plurality of insulating layers IL and the plurality of gate electrodes GE in the third direction. According to the present exemplary embodiment, the plurality of pillars P' are formed through the plurality of insulating layers IL, but unlike the exemplary embodiment shown in FIG. 4, the plurality of pillars P' may not be in contact with the substrate SUB. For example, the plurality of pillars P' may penetrate through the plurality of insulating layers IL to an arbitrary location between the ground selection line GSL and the first word line WL1.

In an exemplary embodiment, each of the pillars P' may include a charge storage layer CS', a channel layer CH', and an inner layer I'. The charge storage layer CS' may have an ONO structure and be formed along a side wall of the channel layer CH'. The channel layer CH' may include a first type silicon material. The inner layer I' may include an insulating material such as a silicon oxide or an air gap.

Drains or drain contacts DR are provided on each of the plurality of pillars P'. For example, the drains or drain contacts DR may include a silicon material that is doped with second conductive type impurities. On the drains DR, bit lines BL1 to BL3 extend in the second direction (e.g., X direction) and are spaced apart by a certain distance in the first direction.

According to the present exemplary embodiment, a string selection transistor SST' connected to the string selection line SSL may be a cell transistor including the charge storage layer CS', whereas a ground selection transistor GST' connected to the ground selection line GSL may be a general transistor that does not include the charge storage layer CS'. In an exemplary embodiment, the channel area CH' with respect to the ground selection transistor GST may include monocrystal silicon that is formed by performing selective epitaxial growth (SEG) on the substrate SUB. Accordingly, since the ground selection transistor GST' is formed in the vertical direction with respect to the substrate SUB even when the channel area CH' of the ground selection transistor GST' includes monocrystal silicon, targeting of a threshold voltage may be difficult.

Therefore, according to the present exemplary embodiment, to reduce leakage current through the ground selection transistor GST or the string selection transistor SST', a negative voltage may be applied as a turn-off voltage of the ground selection line GSL or the string selection line SSL. Then, an off current of the ground selection transistor GST or the string selection transistor SST' may be the same as or lower than an off current limit, and thus, the ground selection transistor GST or the string selection transistor SST' may be normally turned off. As a result, a boosting voltage may decrease less and program disturb may be reduced or eliminated.

Figure 7:
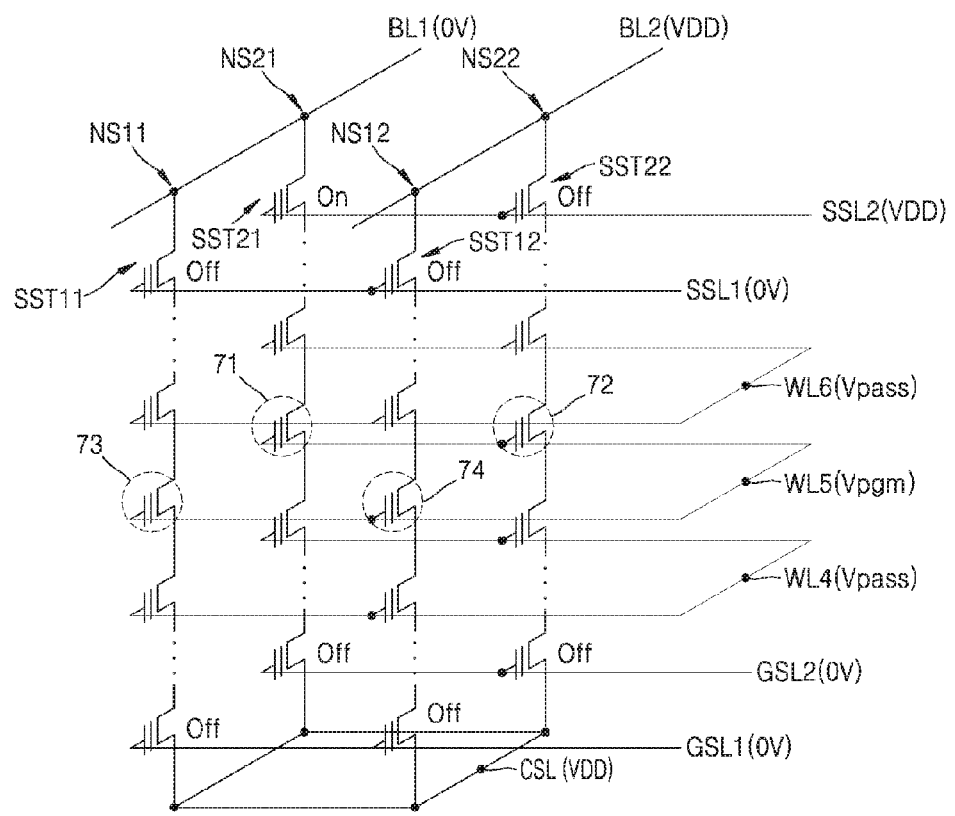
FIG. 7 is a circuit diagram of a program bias condition of the memory device of FIG. 2.

FIG. 7 is a circuit diagram of a program bias condition of the memory device 100 of FIG. 2.

FIG. 7 illustrates a portion of the first block BLK1 shown in FIG. 3, i.e., the strings NS11 and NS21 connected to the first bit line BL1 and the strings NS12 and NS22 connected to the second bit line BL2. According to the present exemplary embodiment, a selected memory cell that is to be programmed may be a memory cell 71 that is connected to a fifth word line WL5, from among a plurality of cells included in the string NS21 connected to the first bit line BL1.

Since word lines that are located at an identical level may be connected to each other in the 3D memory device, an identical voltage may be applied to the word lines located at the identical level. Therefore, non-selected memory cells 72 to 74 may also be connected to the fifth word line WL5, and a program voltage Vpgm may be applied to respective gates of the non-selected memory cells 72 to 74. To inhibit programming of the non-selected memory cells 72 to 74, a separately determined program bias condition may be utilized for voltages applied to the string selection lines SSL1 and SSL2, the ground selection lines GSL1 and GSL2, and the bit lines BL1 and BL2. The program bias condition will be described below.

When the string NS21 is selected, 0V may be applied to the first string selection line SSL1 and the power voltage VDD may be applied to the second string selection line SSL2 during a program operation. 0V may be applied to the first bit line BL1, and the power voltage VDD may be applied to the second bit line BL2. 0V may be applied to the ground selection lines GSL1 and GSL2, and a voltage higher than 0V (e.g., VDD) may be applied to the common source line CSL. The program voltage Vpgm may be applied to a selected word line (e.g., WL5), and a pass voltage Vpass may be applied to a non-selected word line (e.g., WL4 and WL6).

According to the aforementioned program bias condition, the program voltage Vpgm is applied to a gate of the selected memory cell 71, and a channel voltage is 0V. Due to this, a strong electric field is formed between the gate and the channel of the selected memory cell 71, then, electrons in the channel may be injected into a charge trap layer due to F-N tunneling, and thus, the selected memory cell 71 may be programmed. However, since channels of the non-selected memory cells 72 to 74 are in a floating state, channel voltages rise to a boosting voltage Vbst. In this case, since a generated electric field is not sufficient enough for F-N tunneling between respective gates and channels of the non-selected memory cells 72 to 74, the non-selected memory cells 72 to 74 may not be programmed.

Regarding a string selection transistor SST22 connected to the second bit line BL2, the power voltage VDD is applied to the second string selection line SSL2 and the second bit line BL2. In this case, a gate-source voltage Vgs of the string selection transistor SST22 is equal to 0V (i.e., Vgs=0), and a drain-source voltage Vds of the string selection transistor SST22 is equal to "boosting voltage–power voltage" (i.e., Vds=Vbst–VDD). Regarding a string selection transistor SST11 connected to the first bit line BL1, 0V is applied to the first string selection line SSL1 and the first bit line BL1. A gate-source voltage Vgs of the string selection transistor SST11 is equal to 0V (i.e., Vgs=0), but a drain-source voltage Vds of the string selection transistor SST11 is equal to "boosting voltage" (i.e., Vds=Vbst).

Accordingly, the string selection transistor SST11 connected to the first bit line BL1 has a greater drain-source voltage Vds than the string selection transistor SST22 connected to the second bit line BL2. Therefore, since an electric field between a channel of the string NS11 and the first bit line BL1 is greater than an electric field between a channel of the string NS22 and the second bit line BL2, leakage current may increase in the string NS11 connected to the first bit line BL1 and thus program disturb may occur. This may cause leakage current via a string selection transistor based on a bias condition to occur in the 3D memory device.

However, according to the present exemplary embodiment, in at least a portion of a program section, a voltage of the string selection transistor ST11 may be adjusted to a negative level. Then, an off current of the string selection transistor ST11 may be the same as or lower than an off current limit, and the string selection transistor ST11 may be normally turned off. As a result, a decrease in boosting voltage may be reduced and program disturb may be reduced or eliminated.

Likewise, according to the present exemplary embodiment, in at least a portion of the program section, voltages of the ground selection line GSL1 and GSL2 may be controlled to be at a negative level. Then, an off current of a ground selection transistor may be the same as or lower than an off current limit, and the ground selection transistor may be normally turned off. As a result, a boosting voltage may decrease less and program disturb may be reduced or eliminated.

Figure 8:
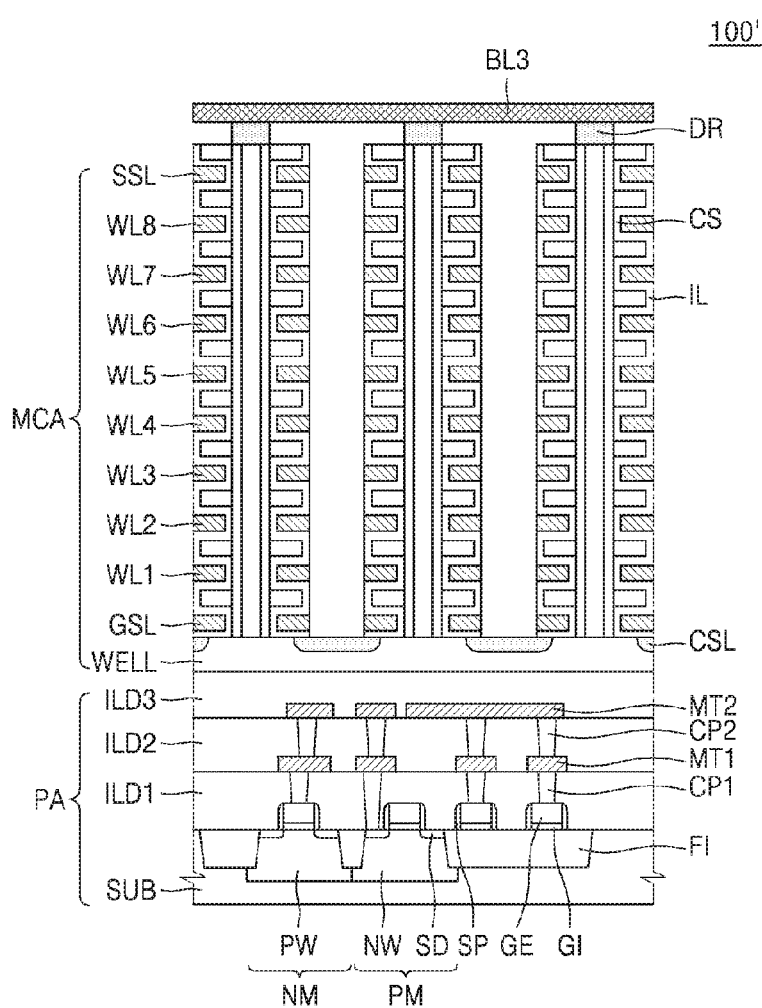
FIG. 8 is a cross-sectional view of an example of the memory device of FIG. 2.

FIG. 8 is a cross-sectional view of an example of a memory device of FIG. 2.

Referring to FIG. 8, a memory device 100' may include a peripheral circuit area PA on a substrate SUB and a memory cell array MCA on the peripheral circuit area PA. The memory device 100' according to the present exemplary embodiment may be a memory device having a cell over peripheral (COP) structure. The memory cell array MCA may correspond to the memory cell array 110 of FIG. 2. The peripheral circuit area PA may correspond to the control logic 120, the voltage generator 130, the row decoder 140, or the page buffer 150 of FIG. 2. However, the exemplary embodiments are not limited thereto, and the peripheral circuit area PA may correspond to various peripheral circuits such as a data I/O circuit.

The peripheral circuit area PA may include transistors NM and PM formed on the substrate SUB. The transistors NM and PM may be respectively formed in a P well PW and an N well NW that are defined by ion injection. Each of the transistors NM and PM may include a source/drain SD, a gate insulating layer GI, a gate electrode GE, and a spacer SP. The peripheral circuit area PA may have a multi-layer wiring structure including a first contact CP1, a first wiring layer MT1, a second contact CP2, and a second wiring layer MT2. The peripheral circuit area PA may further include interlayer insulating layers ILD1, ILD2, and ILD3 that may mutually insulate the multi-layer wiring structure.

The memory cell array MCA may be formed in a vertical direction with respect to a well area WELL formed on the peripheral circuit area PA. For example, the well area WELL may include first conductive type (e.g., p-type) polysilicon. A common source line CSL may be formed by doping second conductive type (e.g., n-type) impurities on the well area WELL. Accordingly, the well area WELL and the common source line CSL may form a P-N junction. In this case, since a breakdown voltage from the well area WELL including polysilicon to the common source line CSL is small, a leakage current issue may occur. In particular, when a voltage applied to the common source line CSL increases during a program operation on the memory cell array MCA, leakage current may further increase.

Therefore, according to the present exemplary embodiment, to reduce leakage current through the ground selection transistor, a ground selection line voltage may be adjusted to a negative level. Then, an off current of the ground selection transistor may be the same as or lower than an off current limit, and the ground selection transistor may be normally turned off. As a result, a boosting voltage may decrease less and program disturb may be reduced or eliminated.

Figure 9A:
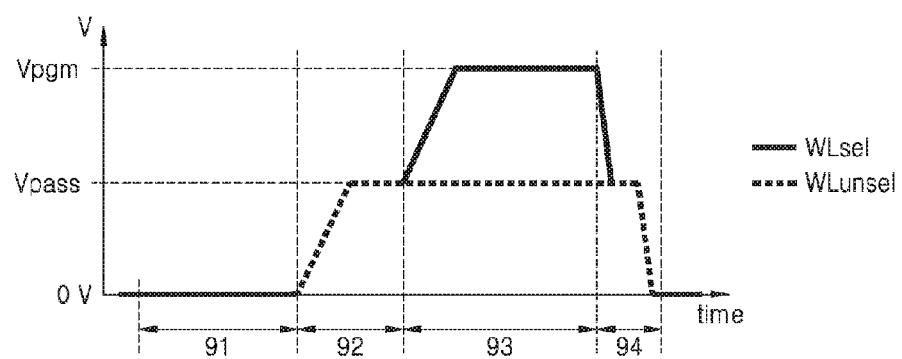
FIGS. 9A to 9C are timing diagrams of program bias conditions according to an exemplary embodiment.
Figure 9B:
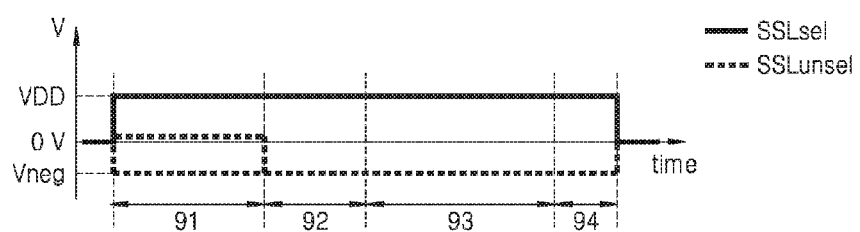
Figure 9C:
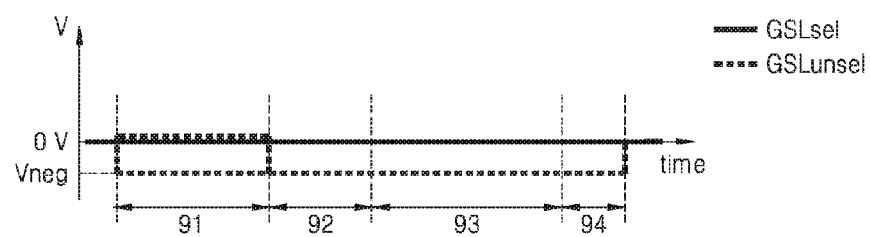

FIGS. 9A to 9C are timing diagrams of program bias conditions according to an exemplary embodiment. FIG. 9A illustrates an example of a word line voltage during a program operation, FIG. 9B illustrates an example of a string selection line voltage during the program operation, and FIG. 9C illustrates an example of a ground selection line voltage during the program operation.

Referring to FIG. 9A, a horizontal axis represents time, and a vertical axis represents voltage. A first section 91 is a bit line setup section, in which voltages are applied to a bit line BL and a common source line CSL but are not applied to word lines. A second section 92 is a word line setup section, in which the pass voltage Vpass is applied to word lines to boost a channel A third section 93 is a program execution section, in which the program voltage Vpgm is applied to a selected word line WLsel and the pass voltage Vpass is continuously applied to a non-selected word line WLunsel. A fourth section 94 is a recovery section, in which a program voltage Vpgm is not applied to the selected word line WLsel.

Referring to FIG. 9B, a horizontal axis represents time, and a vertical axis represents voltage. The power voltage VDD may be applied to a selected string selection line SSLsel during first to fourth sections 91 to 94, and accordingly, the selected string selection line may be turned on. According to an exemplary embodiment, the negative voltage Vneg may be applied to a non-selected string selection line SSLunsel during the first to fourth sections 91 to 94. According to an exemplary embodiment, the negative voltage Vneg may be applied to the non-selected string selection line during the second to fourth sections 92 to 94.

Referring to FIG. 9C, a horizontal axis represents time, and a vertical axis represents voltage. A ground voltage (0V) may be applied to a selected ground selection line GSLsel during first to fourth sections 91 to 94. According to an exemplary embodiment, the negative voltage Vneg may be applied to a non-selected ground selection line GSLunsel during the first to fourth sections 91 to 94. According to an exemplary embodiment, the negative voltage Vneg may be applied to the non-selected ground selection line during the second to fourth sections 92 to 94.

The first to fourth sections 91 to 94 may be referred to as 'program section.' The first to fourth sections 91 to 94 may correspond to a loop for performing the program operation. According to an exemplary embodiment, the negative voltage Vneg may be applied to the non-selected string selection line during the program section or at least a portion of the program section. According to an exemplary embodiment, the negative voltage Vneg may be applied to the non-selected ground selection line during the program section or at least a portion of the program section. According to an exemplary embodiment, the negative voltage Vneg may be applied to the non-selected string selection line and the non-selected ground selection line during the program section or at least a portion of the program section FIG. 10 is a flowchart of an operation method of a memory device, according to an exemplary embodiment.

Figure 10:
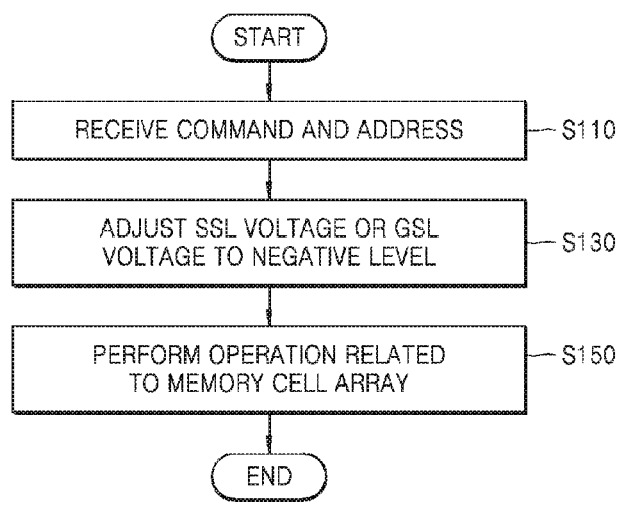
FIG. 10 is a flowchart of an operation method of a memory device, according to an exemplary embodiment.

Referring to FIG. 10, the method according to the present exemplary embodiment is performed by the memory device when a command and an address are received from a memory controller. For example, the method may include operations sequentially performed in the memory device 100 of FIG. 2. Descriptions of features that are already described with reference to FIGS. 1 to 9C and applied to the present exemplary embodiment will not be repeated.

In operation S110, a command and an address are received from the memory controller. According to an exemplary embodiment, the command may include a program command, and the address may indicate an address of a memory cell in which the program operation is to be performed. According to an exemplary embodiment, the command may include a read command, and the address may indicate an address of a memory cell in which a read operation is to be performed. In particular, operations of the control logic 120 may be started when the control logic 120 receives the command and the address from the memory controller 200.

In operation S130, a string selection line voltage or a ground selection line voltage is adjusted to a negative level. In an exemplary embodiment, the voltage controller 121 may generate a voltage control signal CTRL_vol such that a string selection line voltage and/or a ground selection line voltage have/has a negative level during at least a portion of a program section or at least a portion of a read section, and apply the generated voltage control signal CTRL_vol to the voltage generator 130.

In operation S150, an operation related to a memory cell array is performed. According to an exemplary embodiment, the control logic 120 may generate the row address X-ADDR that is activated during the program section, and provide the generated row address X-ADDR to the row decoder 140. Also, the control logic 120 may generate the column address Y-ADDR that is activated during the program section, and provide the generated column address Y-ADDR to the page buffer 150. Accordingly, the program operation related to the memory cell array may be performed by providing voltages corresponding to the word line WL, the string selection line SSL, and the ground selection line GSL based on the row address X-ADDR by using the row decoder 140, and providing a voltage corresponding to the bit line BL based on the column address Y-ADDR by using the page buffer 150.

According to some exemplary embodiments, the control logic 120 may generate the row address X-ADDR that is activated during a read section, and provide the generated row address X-ADDR to the row decoder 140. Also, the control logic 120 may generate the column address Y-ADDR that is activated during the read section, and provide the generated column address Y-ADDR to the page buffer 150. Accordingly, the read operation related to the memory cell array may be performed by providing voltages corresponding to the word line WL, the string selection line SSL, and the ground selection line GSL based on the row address X-ADDR by using the row decoder 140, and detecting a voltage of the bit line BL based on the column address Y-ADDR by using the page buffer 150.

Figure 11A:
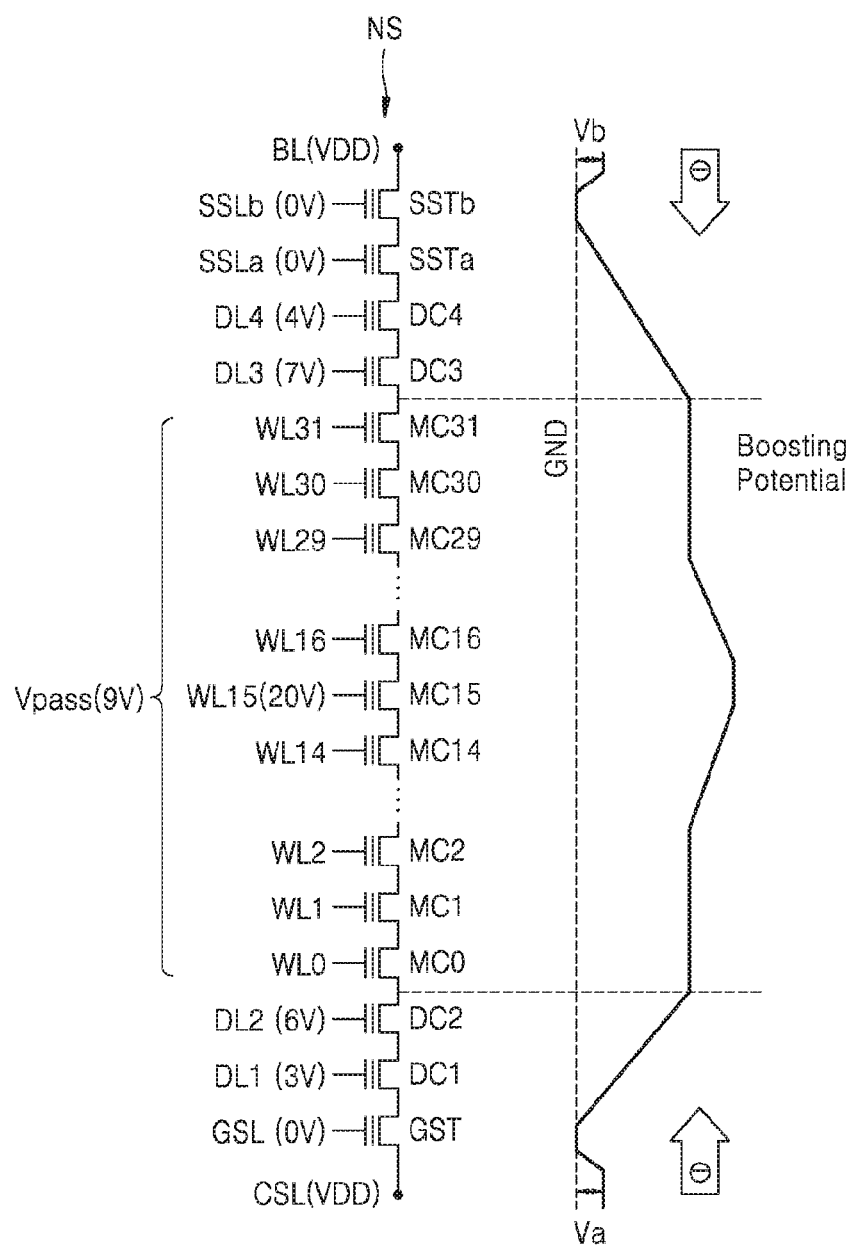
FIGS. 11A and 11B illustrate program bias conditions and boosting potentials based on the program bias conditions, according to exemplary embodiments.
Figure 11B:
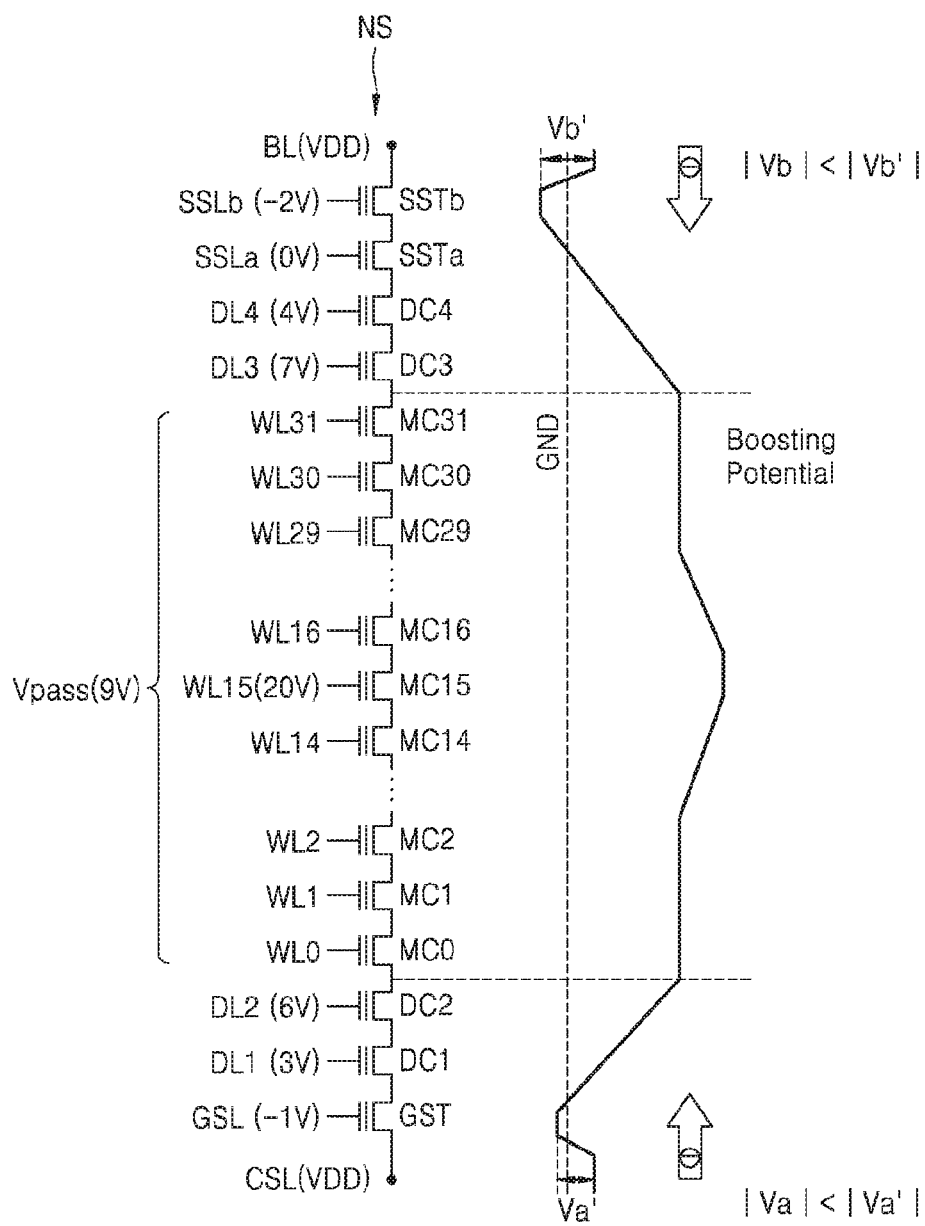

FIGS. 11A and 11B illustrate program bias conditions and boosting potentials based on the program bias conditions, according to exemplary embodiments.

Referring to FIG. 11A, a string NS may include a ground selection transistor GST, a plurality of memory cells (or may be referred to as 'main cells') MC0 to MC31, and a plurality of string selection transistors SSTa and SSTb. Dummy cells DC1 and DC2 may be located between the ground selection transistor GST and the memory cells MC0 to MC31, and dummy cells DC3 and DC4 may be located between the memory cells MC0 to MC31 and the string selection transistors SSTa and SSTb. However, the exemplary embodiments are not limited thereto. The number of ground selection transistors, memory cells, dummy cells, or string selection transistors may vary according to exemplary embodiments.

The string NS may be a non-selected string connected to a non-selected string selection line SSL and a non-selected bit line BL. The string NS may correspond to, for example, the string NS12 of FIG. 12. Therefore, the string selection transistors SSTa and SSTb and the ground selection transistor GST may be turned off, and a power voltage VDD may be applied to a bit line BL and a common source line CSL. Also, a channel area may be floated by a pass voltage Vpass (e.g., 9V) applied to non-selected word lines and a program voltage Vpgm (e.g., 20V) applied to a selected word line (e.g., WL15), and may maintain a boosting potential.

An abrupt alteration in the boosting potential of the string NS may cause band-to-band tunneling. Therefore, voltages applied to dummy lines DL1 to DL4, string selection lines SSLa and SSLb, and a ground selection line GSL may be adjusted according to the number and locations of the string selection transistors SSTa and SSTb and the ground selection transistor GST such that the boosting potential decreases by a certain slope from a center area of the string NS corresponding to the memory cells MC0 to MC31 to edge areas of the string NS corresponding to the string selection transistors SSTa and SSTb and the ground selection transistor GST.

In an exemplary embodiment, since the number of string selection transistors SSLa and SSLb is different from the number of ground selection transistors GST in the string NS, voltages of the dummy lines DL3 and DL4 connected to the dummy cells DC3 and DC4 near the string selection transistors SSLa and SSLb may be set differently from voltages of the dummy lines DL1 and DL2 connected to the dummy cells DL1 and DL2 near the ground selection transistor GST. For example, a voltage of a first dummy line DL1 may be 3V, a voltage of a second dummy line DL2 may be 6V, a voltage of a third dummy line DL3 may be 7V, and a voltage of a fourth dummy line DL4 may be 4V.

According to the present exemplary embodiment, during at least a portion of a program section, 0V may be applied to the string selection lines SSLa and SSLb and the ground selection line GSL, and a power voltage VDD may be applied to the bit line BL and the common source line CSL. Therefore, a potential difference Va between the common source line CSL and the ground selection transistor GST and a potential difference Vb between the bit line BL and the string selection transistor SSTb may be equal to VDD.

Referring to FIG. 11B, according to the present exemplary embodiment, during at least a portion of a program section, a negative voltage may be applied to the ground selection line GSL and at least one of the string selection lines SSLa and SSLb. For example, 0V may be applied to the string selection line SSLa, −2V may be applied to the string selection line SSLb, and −1V may be applied to the ground selection line GSL. By doing so, off currents of the string selection transistor SSTb and the ground selection transistor GST may be adjusted and be the same as or lower than an off current limit, and thus, leakage current of the string NS may be reduced and program disturb may be reduced or eliminated.

During the program section, the power voltage VDD may be applied to the common source line CSL. In this case, a potential difference Va' between the common source line CSL and the ground selection transistor GST is equal to VDD+1, and accordingly, Va' is greater than Va (i.e., |Va|<|Va'|). Therefore, a potential barrier of electrons that flow into channel areas of the memory cells MC0 to MC31 from the common source line CSL is higher than that of FIG. 11A, and an amount of the electrons that flow into the channel areas of the memory cells MC0 to MC31 from the common source line CSL may be less than that of FIG. 11A, which thus may reduce program disturb.

Also, during the program section, the power voltage VDD may be applied to the bit line BL. In this case, a potential difference Vb' between the bit line BL and the string selection transistor SSTb is equal to VDD+2, and accordingly, Vb' is greater than Vb (i.e., |Vb|<|Vb'|). Therefore, a potential barrier of electrons that flow into channel areas of the memory cells MC0 to MC31 from the common source line CSL is higher than that of FIG. 11A, and an amount of the electrons that flow into the channel areas of the memory cells MC0 to MC31 from the common source line CSL may be less than that of FIG. 11A, which thus may reduce program disturb.

Figure 12:
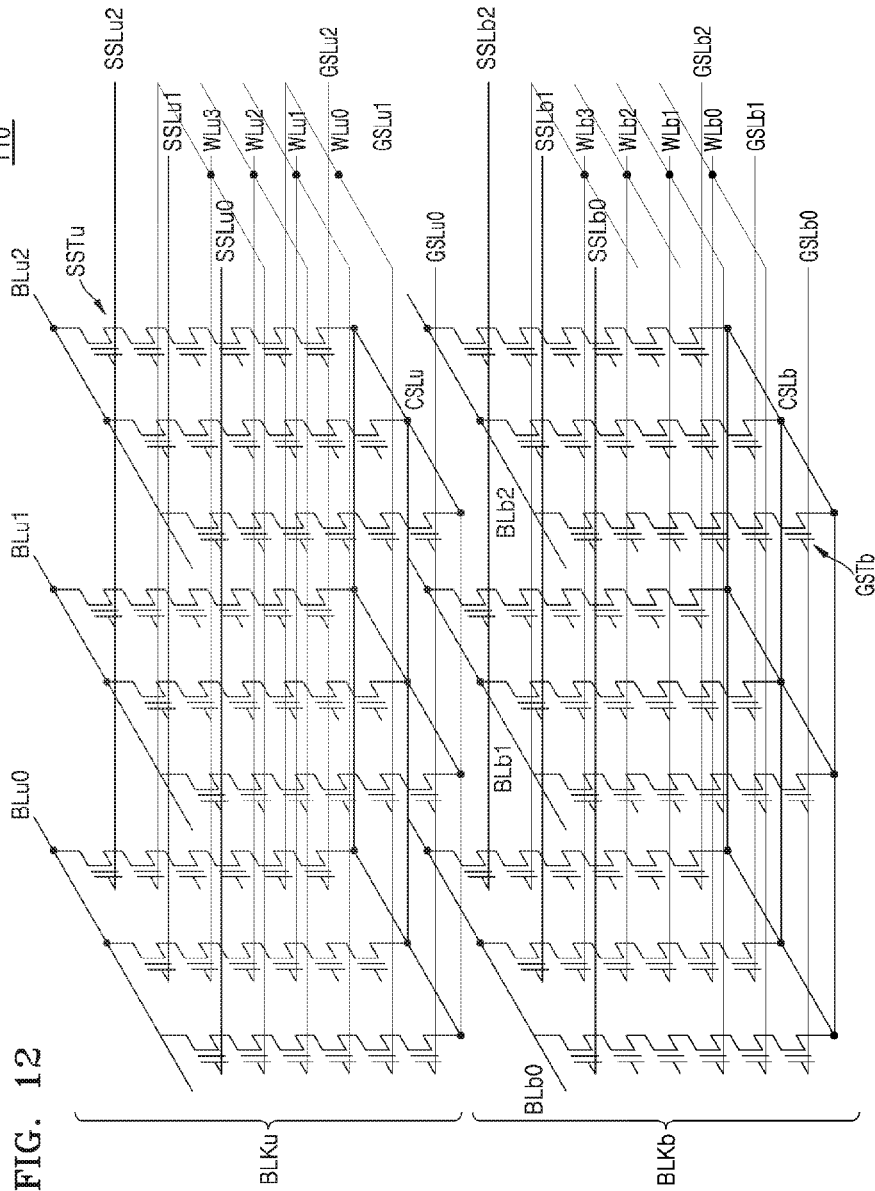
FIG. 12 is a circuit diagram of an example of a memory cell array of FIG. 2.

FIG. 12 is a circuit diagram of an example of a memory cell array of FIG. 2.

Referring to FIG. 12, a memory cell array 110' may include a plurality of blocks BLKb and BLKu that are vertically arranged. In an exemplary embodiment, the memory cell array 110' may include a lower block BLKb on a substrate and an upper block BLKu on the lower block BLKb. The lower block BLKb and the upper block BLKu may be vertical structure NAND flash memories.

The lower block BLKb may include a plurality of NAND strings, a plurality of word lines WLb0 to WLb3, a plurality of bit lines BLb0 to BLb2, a plurality of ground selection lines GSLb0 to GSLb2, a plurality of string selection lines SSLb0 to SSLb2, and a common source line CSLb. The number of NAND strings, word lines, bit lines, ground selection lines, and string selection lines may vary according to exemplary embodiments.

The upper block BLKu may include a plurality of NAND strings, a plurality of word lines WLu0 to WLu3, a plurality of bit lines BLu0 to BLu2, a plurality of ground selection lines GSLu0 to GSLu2, a plurality of string selection lines SSLu0 to SSLu2, and a common source line CSLu. The number of NAND strings, word lines, bit lines, ground selection lines, and string selection lines may vary according to exemplary embodiments.

As described above, the lower block BLKb and the upper block BLKu may be substantially similar to each other as well as the first block BLK1 shown in FIG. 3. Therefore, descriptions of features that are already described with reference to FIG. 3 and applied to the present exemplary embodiment will not be repeated.

The ground selection lines GSLb0 to GSLb2 and the string selection lines SSLb0 to SSLb2 in the lower block BLKb, and the ground selection lines GSLu0 to GSLu2 and the string selection lines SSLu0 to SSLu2 in the upper block BLKu may be formed in different ways according to locations, and thus, may have different electric properties.

Therefore, according to the present exemplary embodiment, during at least a portion of the program section, a negative voltage may be applied to a string selection line or a ground selection line in at least one of the lower block BLKb and the upper block BLKu. For example, the negative voltage may be applied to only the string selection line SSLb0 in the lower block BLKb, and bias voltages of other selection lines may be changed by performing optimization of a threshold voltage of a string selection transistor/ground selection transistor, bias correction of other word lines, adjustment of cell distribution locations, etc.

Figure 13:
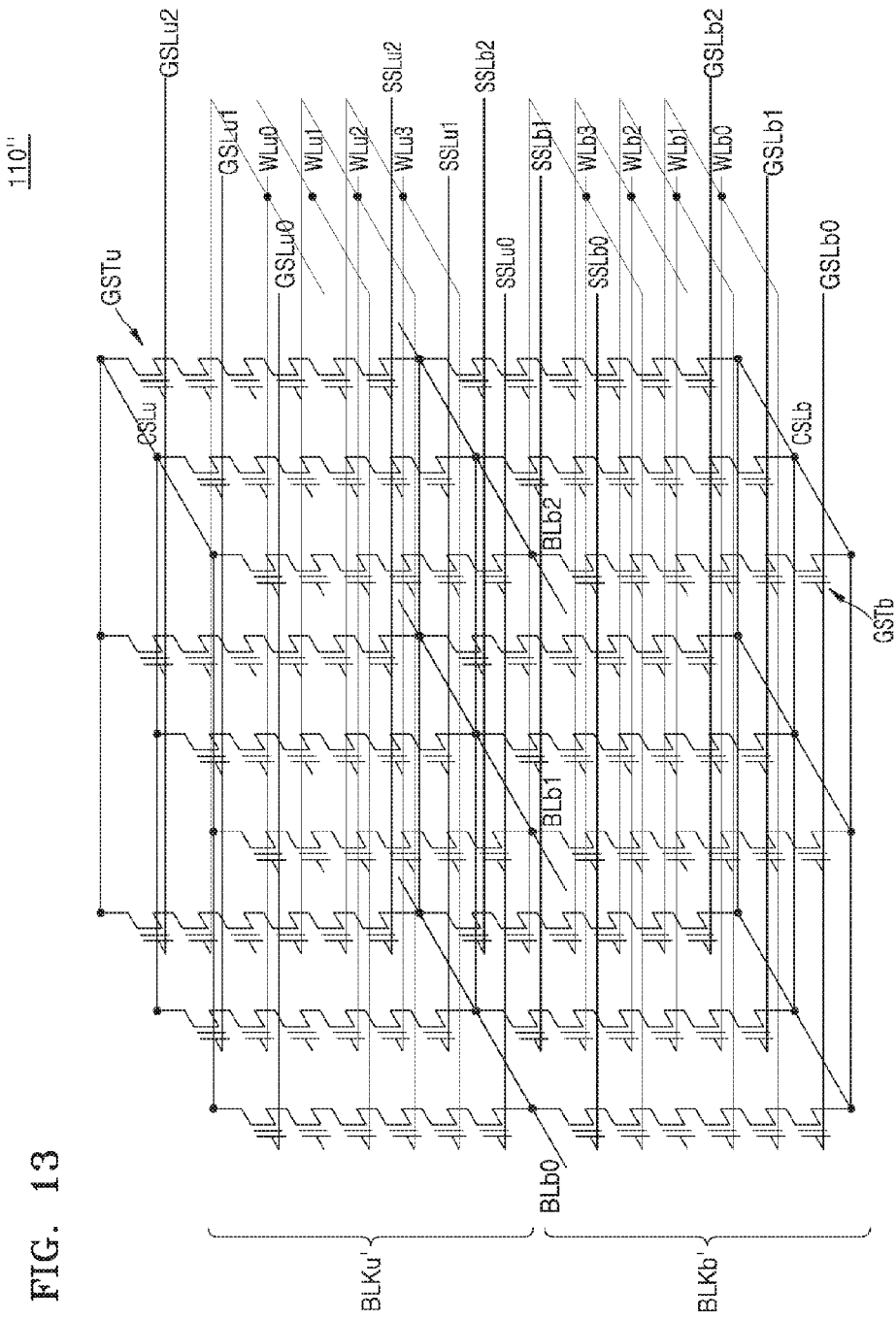
FIG. 13 is a circuit diagram of another example of a memory cell array of FIG. 2.

FIG. 13 is a circuit diagram of another example of a memory cell array of FIG. 2.

Referring to FIG. 13, a memory cell array 110'' may include a plurality of blocks BLKb' and BLKu' that are vertically arranged. In an exemplary embodiment, the memory cell array 110'' may include a lower block BLKb' on a substrate and an upper block BLKu' on the lower block BLKb'. The lower block BLKb' and the upper block BLKu' may be vertical structure NAND flash memories. The memory cell array 110'' according to the present exemplary embodiment is a modified exemplary embodiment of the memory cell array 110' of FIG. 12. Differences between the exemplary embodiments will be mainly described below.

The lower block BLKb' may include a plurality of NAND strings, a plurality of word lines WLb0 to WLb3, a plurality of bit lines BLb0 to BLb2, a plurality of ground selection lines GSLb0 to GSLb2, a plurality of string selection lines SSLb0 to SSLb2, and a common source line CSLb. The number of NAND strings, word lines, bit lines, ground selection lines, and string selection lines may vary according to exemplary embodiments.

The upper block BLKu' may include a plurality of NAND strings, a plurality of word lines WLu0 to WLu3, a plurality of bit lines BLb0 to BLb2, a plurality of ground selection lines GSLu0 to GSLu2, a plurality of string selection lines SSLu0 to SSLu2, and a common source line CSLu. The number of NAND strings, word lines, bit lines, ground selection lines, and string selection lines may vary according to exemplary embodiments.

As described above, the upper block BLKu' may be formed by vertically flipping the lower block BLKb' with respect to the substrate. The upper block BLKu' and the lower block BLKb' may share the plurality of bit lines BLb0 to BLb2. Also, the upper block BLKu' and the lower block BLKb' may share corresponding word lines. For example, the word line WLu0 and the word line WLb0 may be connected to each other.

According to the present exemplary embodiment, the ground selection lines GSLb0 to GSLb2 in the lower block BLKb' may be formed on, for example, a P well, and the common source line CSLb may be formed by doping the P Well with impurities. By doing so, the P well and the common source line CSLb forms a P-N junction. Accordingly, ground selection transistors GSTb in the lower block BLKb' may be formed with a structure similar to that of ground selection transistors GSTb in the lower block BLKb of FIG. 12.

However, the ground selection lines GSLu0 to GSLb2 in the upper block BLKu' are not formed on the P well, and the common source line CSLu may be formed as, for example, a metal line. Therefore, ground selection transistors GSTu in the upper block BLKu' may be formed with a structure similar to that of string selection transistors SSTu in the upper block BLKu of FIG. 12. Also, the ground selection transistors GSTu in the upper block BLKu' may have an electric characteristic similar to that of the string selection transistors SSTu in the upper block BLKu of FIG. 12. Also, a bias condition of the ground selection transistors GSTu in the upper block BLKu' may be similar to a bias condition of the string selection transistors SSTu in the upper block BLKu of FIG. 12.

Therefore, according to the present exemplary embodiment, during at least a portion of the program section, a negative voltage may be applied to a string selection line or a ground selection line in at least one of the lower block BLKb' and the upper block BLKu'. For example, the negative voltage may be applied to only the ground selection line GSLu0 of the upper block BLKu', and bias voltages of other selection lines may be changed by performing optimization of a threshold voltage of a string selection transistor/ground selection transistor, bias correction of other word lines, adjustment of cell distribution locations, etc.

Figure 14:
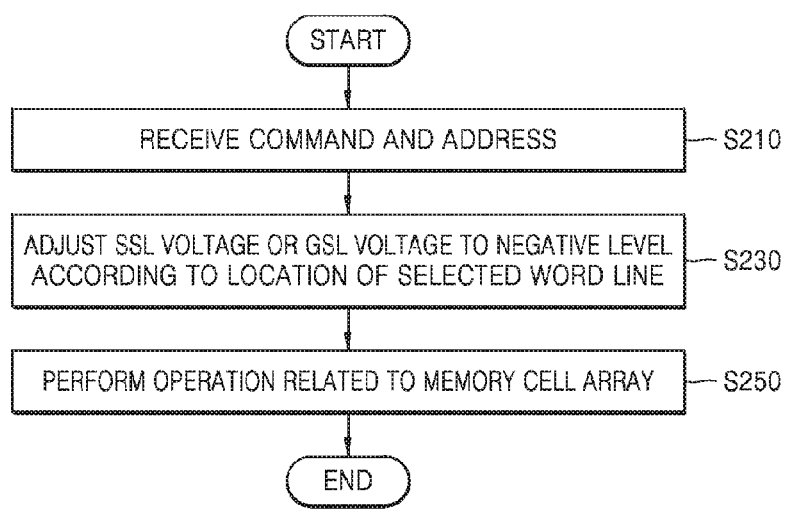
FIG. 14 is a flowchart of an operation method of a memory device, according to an exemplary embodiment.

FIG. 14 is a flowchart of an operation method of a memory device, according to an exemplary embodiment.

Referring to FIG. 14, the method according to the present exemplary embodiment includes operations for a memory cell array performed by the memory device when a command and an address are received from a memory controller. For example, the method may include operations sequentially performed in the memory device 100 of FIG. 2. The method according to the present exemplary embodiment is a modified exemplary embodiment of the method of FIG. 10. Descriptions of features that are already described with reference to FIGS. 1 to 13 and applied to the present exemplary embodiment will not be repeated.

In operation S210, a command and an address are received from the memory controller. According to an exemplary embodiment, the command may include a program command, and the address may indicate an address of a memory cell in which the program operation is to be performed. According to an exemplary embodiment, the command may include a read command, and the address may indicate an address of a memory cell in which a read operation is to be performed. Operations of the control logic 120 may be started when the control logic 120 receives the command and the address from the memory controller 200.

In operation S230, a string selection line voltage or a ground selection line voltage is adjusted to a negative level according to a location of a selected word line. In an exemplary embodiment, the voltage controller 121 may generate a voltage control signal CTRL_vol such that a string selection line voltage and/or a ground selection line voltage have/has a negative level during at least a portion of a program section or at least a portion of a read section, and apply the generated voltage control signal CTRL_vol to the voltage generator 130.

According to an exemplary embodiment, when the selected word line is near a lower edge of a string, a ground selection line voltage may be adjusted to a negative level. However, exemplary embodiments are not limited thereto. According to some exemplary embodiments, when the selected word line is near the lower edge of the string, the ground selection line voltage may be adjusted to 0V.

According to an exemplary embodiment, when the selected word line is near an upper edge of the string, a string selection line voltage may be adjusted to a negative level. However exemplary embodiments are not limited thereto. According to some exemplary embodiments, when the selected word line is near the upper edge of the string, the string selection line voltage may be adjusted to 0V.

In operation S250, an operation related to the memory cell array is performed. According to an exemplary embodiment, a program operation related to the memory cell array may be performed. According to an exemplary embodiment, a read operation related to the memory cell array may be performed.

Figure 15:
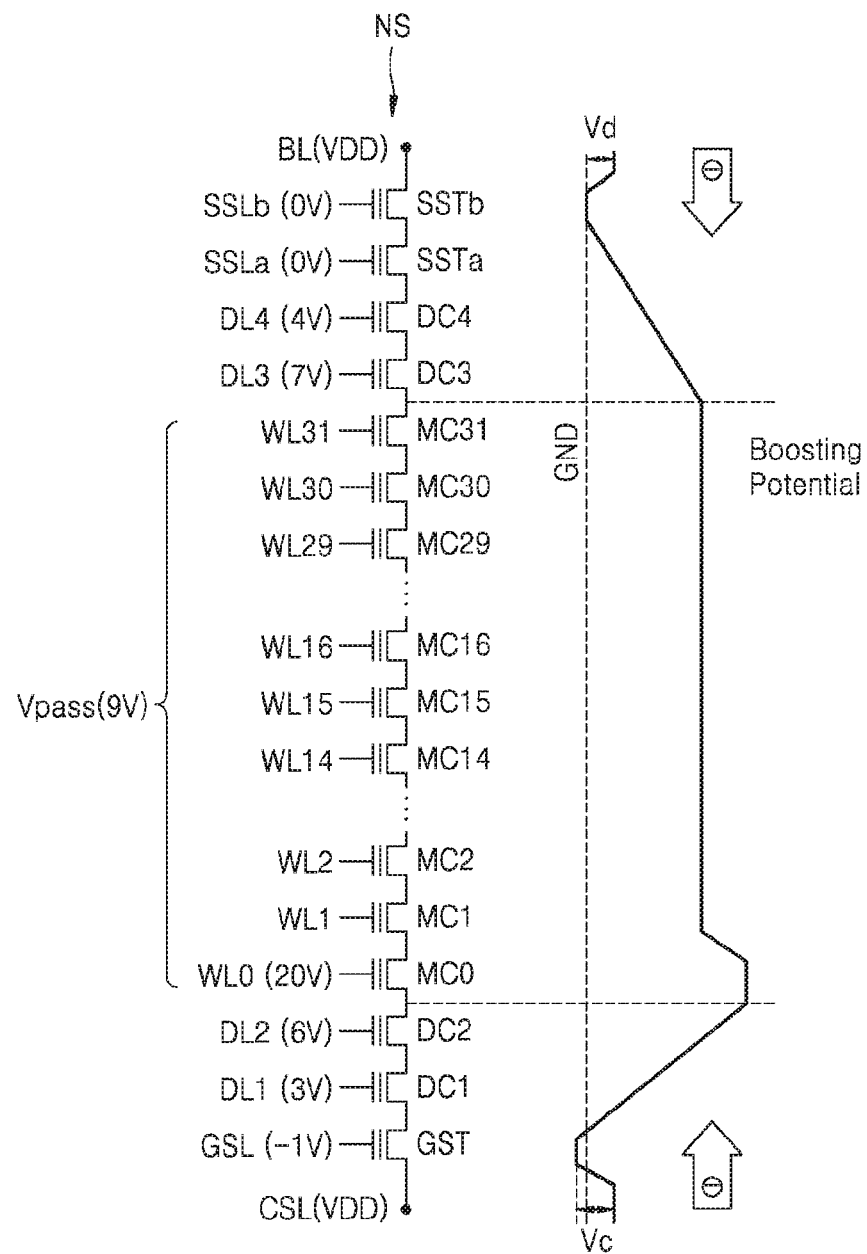
FIG. 15 illustrates an example of a program bias condition according to the method of FIG. 14 and a boosting potential based on the program bias condition.

FIG. 15 illustrates an example of a program bias condition according to the method of FIG. 14 and a boosting potential based on the program bias condition.

Referring to FIG. 15, a string NS may include a ground selection transistor GST, a plurality of memory cells MC0 to MC31, and a plurality of string selection transistors SSTa and SSTb. Dummy cells DC1 and DC2 may be located between the ground selection transistor GST and the memory cells MC0 to MC31, and dummy cells DC3 and DC4 may be located between the memory cells MC0 to MC31 and the string selection transistors SSTa and SSTb. However, the exemplary embodiments are not limited thereto. The number of ground selection transistors, memory cells, dummy cells, or string selection transistors may vary according to exemplary embodiments.

The string NS may be a non-selected string connected to a non-selected string selection line SSL and a non-selected bit line BL. The string NS may correspond to, for example, the string NS12 of FIG. 7. Therefore, the string selection transistors SSTa and SSTb and the ground selection transistor GST may be turned off, and a power voltage VDD may be applied to a bit line BL and a common source line CSL. Also, a channel area may be floated by a pass voltage Vpass (e.g., 9V) applied to non-selected word lines and maintain a boosting potential.

According to the present exemplary embodiment, due to a program voltage Vpgm (e.g., 20V) applied to a selected word line (e.g., WL0), local boosting may occur in a channel area corresponding to the selected word line WL0. When such local boosting occurs near a lower edge area of the string NS, a boosting potential in a channel area corresponding to a dummy line DL2 increases, and thus, a slope of a potential from the dummy line DL2 to the common source line CSL increases. When a drain-source voltage Vds of the ground selection transistor GST increases, due to a large electric field between a channel of the string NS and the common source line CSL, leakage current increases in the string NS and thus program disturb occurs.

According to the present exemplary embodiment, a negative voltage (e.g., −1V) may be applied to the ground selection line GSL to adjust and make an off current of the ground selection transistor GST be the same as or lower than an off current limit. Accordingly, leakage current through the ground selection transistor GST may be reduced. When a magnitude of the negative voltage applied to the ground selection line GSL increases excessively, a gate induced drain leakage current (GIDL) phenomenon may occur. According to the present exemplary embodiment, the magnitude of the negative voltage applied to the ground selection line GSL may be reduced to be within an appropriate range.

Figure 16:
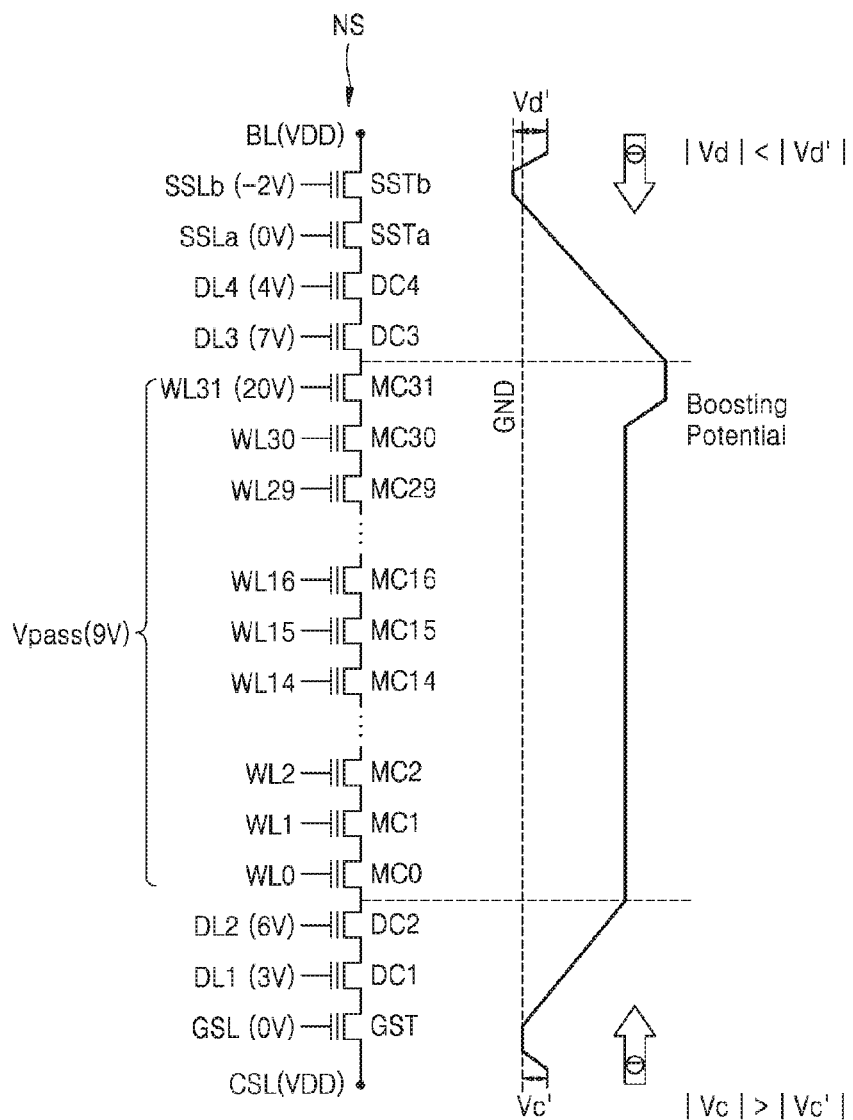
FIG. 16 illustrates another example of a program bias condition according to the method of FIG. 14 and a boosting potential based on the program bias condition.

FIG. 16 illustrates another example of a program bias condition according to the method of FIG. 14 and a boosting potential based on the program bias condition.

Since a structure of a string NS of FIG. 16 is similar to that of FIG. 15, the structure of the string NS will not be described in detail. According to the present exemplary embodiment, due to a program voltage Vpgm (e.g., 20V) applied to a selected word line (e.g., WL31), local boosting may occur in a channel area corresponding to the selected word line WL31. When such local boosting occurs near an upper edge area of the string NS, a boosting potential in a channel area corresponding to a dummy line DL3 increases, and thus, a slope of a potential from the dummy line DL3 to the bit line BL increases. Therefore, when a drain-source voltage Vds of a string selection transistor SSTb increases, due to a large electric field between a channel of the string NS and the bit line BL, leakage current increases in the string NS and thus program disturb occurs.

According to the present exemplary embodiment, a negative voltage (e.g., −2V) may be applied to a string selection line SSLb to adjust and make an off current of the string selection transistor SSTb be the same as or lower than an off current limit. Accordingly, leakage current through the string selection transistor SSTb may be reduced. When a magnitude of the negative voltage applied to a string selection transistor SSLb selection line GSL increases excessively, the GIDL phenomenon may occur. According to the present exemplary embodiment, the magnitude of the negative voltage applied to the string selection line SSLb may be reduced within an appropriate range.

Figure 17:
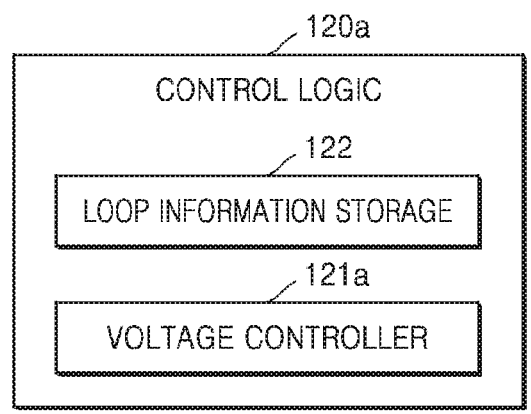
FIG. 17 is a block diagram of an example of a control logic of FIG. 2, according to an exemplary embodiment.

FIG. 17 is a block diagram of an example of the control logic 120 of FIG. 2, according to an exemplary embodiment.

Referring to FIG. 17, a control logic 120a may include a voltage controller 121a and a loop information storage unit 122. The control logic 120a according to the present exemplary embodiment is a modified exemplary embodiment of the control logic 120 of FIG. 2. In comparison to the control logic 120 of FIG. 2, the control logic 120a may further include the loop information storage unit 122.

The loop information storage unit 122 may store information of a corresponding loop count from among a plurality of program loops in a single program cycle. The loop count indicates the number of loops. The loop information storage unit 122 may include a latch or a register. According to an exemplary embodiment, loop information may be stored in an area of the memory cell array 110. According to some exemplary embodiments, the loop information may be stored in a buffer memory of a memory controller.

The voltage controller 121a may generate a voltage control signal CTRL_vol such that a string selection line voltage and a ground selection line voltage changes according to a loop count. Also, the voltage controller 121a may generate the voltage control signal CTRL_vol such that a program voltage applied to a word line increases as a loop count increases. Furthermore, the voltage controller 121a may generate the voltage control signal CTRL_vol such that a dummy line voltage changes according to a loop count.

Accordingly, since the program voltage applied to a selected word line may increase as the loop count increases, according to an exemplary embodiment, the voltage controller 121a may generate the voltage control signal CTRL_vol such that the string selection line voltage and the ground selection line voltage changes according to the program voltage applied to the selected word line.

According to an exemplary embodiment, the voltage controller 121a may generate the voltage control signal CTRL_vol such that a string selection line voltage applied to a non-selected string selection line connected to a non-selected memory cell has a negative level in a program section and changes according to a loop count. According to an exemplary embodiment, the voltage controller 121 may generate the voltage control signal CTRL_vol such that the string selection line voltage has a negative level and changes according to the loop count in at least a portion of the program section.

According to an exemplary embodiment, the voltage controller 121a may generate the voltage control signal CTRL_vol such that a ground selection line voltage applied to a non-selected ground selection line connected to a non-selected memory cell has a negative level and changes according to a loop count in a program section. According to some exemplary embodiments, the voltage controller 121a may generate the voltage control signal CTRL_vol such that the ground selection line voltage has a negative level and changes according to the loop count in at least a portion of the program section.

Figure 18:
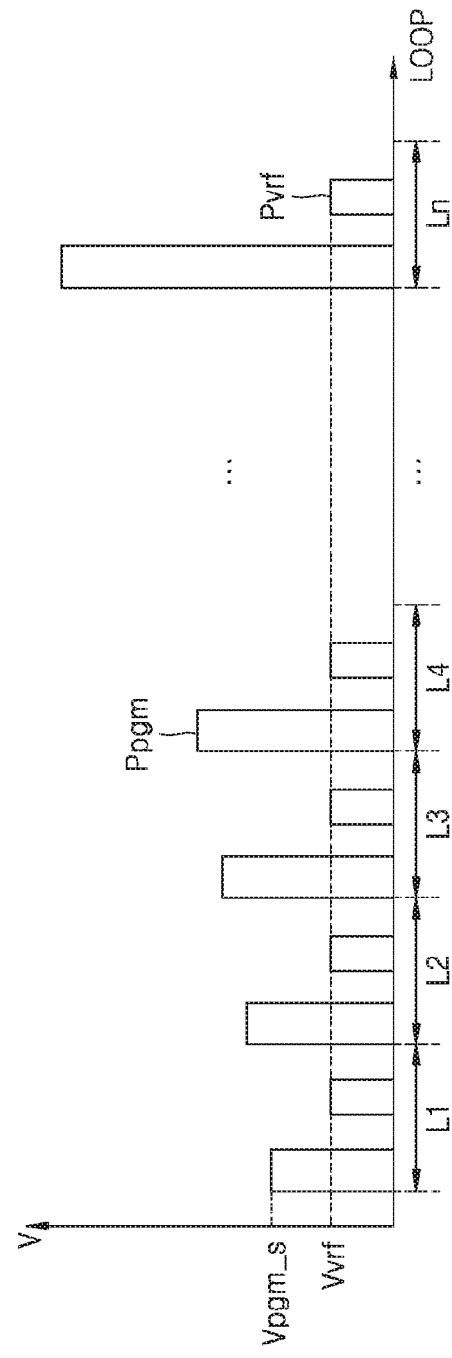
FIG. 18 is a graph of voltages applied to a selected word line in a plurality of program loops during a program operation, according to an exemplary embodiment.

FIG. 18 is a graph of voltages applied to a selected word line in a plurality of program loops during a program operation, according to an exemplary embodiment.

Referring to FIG. 18, a horizontal axis represents a loop count, and a vertical axis represents voltage. During a first loop L1, a program pulse Ppgm having a program start voltage level Vpgm_s and a verification pulse Pvrf having a program verification voltage level Vvrf may be sequentially applied to a selected word line. During a second loop L1, a program pulse Ppgm having a higher voltage level than the program start voltage level Vpgm_s and the verification pulse Pvrf having the program verification voltage level Vvrf may be sequentially applied to the selected word line. According to the present exemplary embodiment, as the loop count increases, a magnitude of the program pulse Ppgm may gradually increase but a magnitude of the verification pulse Pvrf may be constant.

However, the exemplary embodiments are not limited thereto. According to some exemplary embodiments, a pulse width of a program pulse may gradually increase as the loop count increases. According to some exemplary embodiments, an amplitude and a pulse width of a program pulse may gradually increase as the loop count increases. Also, according to some exemplary embodiments, a verification pulse may not be applied to a word line in a loop corresponding to a loop count that is the same as or smaller than a threshold value.

Hereinafter, a section in each loop where the program pulse Ppgm is applied is referred to as a program execution section, and a section in each loop where the verification pulse Pvrf is applied is referred to as a program verification section.

Figure 19:
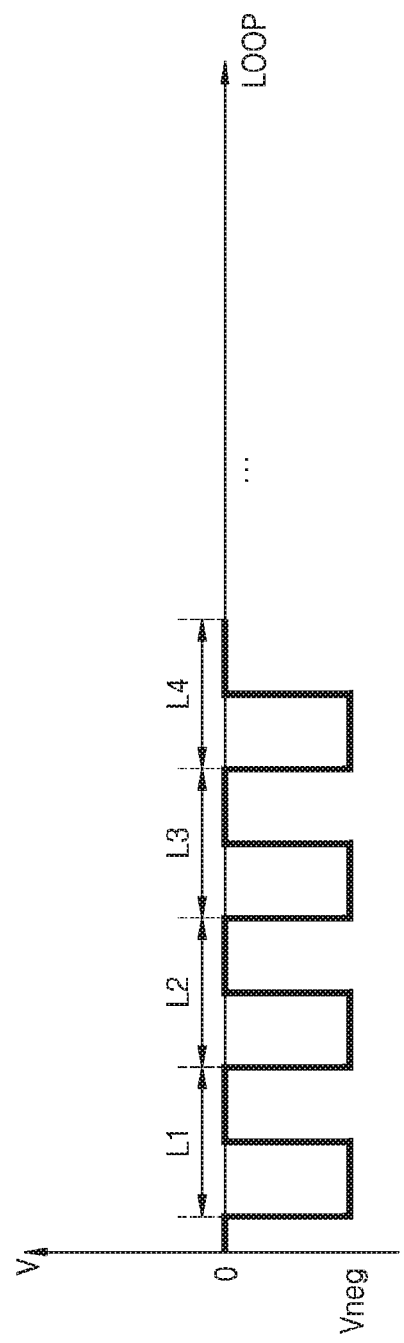
FIG. 19 is a graph of voltages applied to a selection transistor according to a program loop, according to an exemplary embodiment.

FIG. 19 is a graph of voltages applied to a selection transistor according to a program loop, according to an exemplary embodiment.

Referring to FIG. 19, a horizontal axis represents a loop count, and a vertical axis represents voltage. According to the present exemplary embodiment, the voltage controller 121a may generate the voltage control signal CTRL_vol such that a voltage applied to a gate of a string selection transistor or ground selection transistor has a constant negative level Vneg regardless of a program loop count. Accordingly, an off current of a turned off string selection transistor or ground selection transistor may be the same as or lower than an off current limit, and thus, leakage current in a non-selected string may be reduced.

In an exemplary embodiment, the voltage controller 121a may generate the voltage control signal CTRL_vol such that, a voltage applied to the gate of the string selection transistor or ground selection transistor has a constant negative level Vneg regardless of the loop count in a program execution section of each program loop and a voltage applied to the gate of the string selection transistor or ground selection transistor has a ground level (i.e., 0V) in a program verification section of each program loop.

However, the exemplary embodiments are not limited thereto. According to some exemplary embodiments, the voltage controller 121a may generate the voltage control signal CTRL_vol such that a voltage applied to the gate of the string selection transistor or ground selection transistor has a negative level in the program verification section of each program loop. In this case, the voltage applied to the string selection transistor or the ground selection transistor in the program execution section may have a different level from the voltage applied to the string selection transistor or the ground selection transistor in the program verification section.

Figure 20:
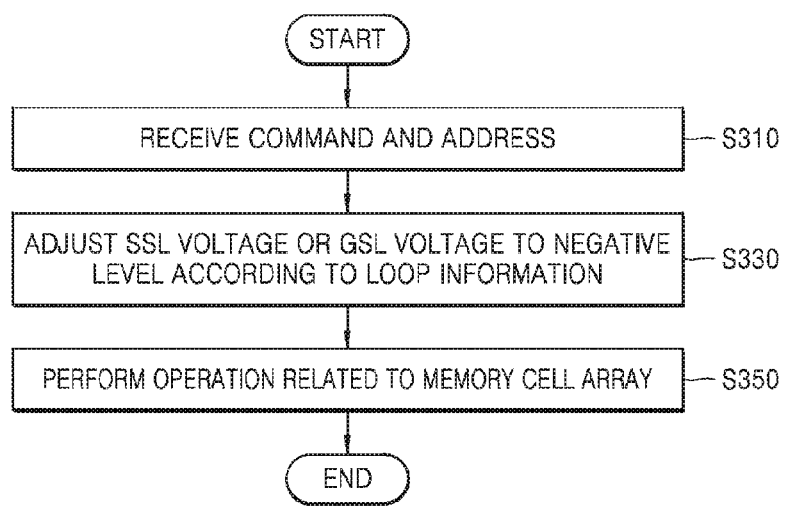
FIG. 20 is a flowchart of an operation method of another memory device, according to an exemplary embodiment.

FIG. 20 is a flowchart of an operation method of another memory device, according to an exemplary embodiment.

Referring to FIG. 20, the method according to the present exemplary embodiment is performed by the memory device when a command and an address are received from a memory controller. For example, the method may include operations sequentially performed in the memory device of FIG. 17 that includes the control logic 120a. Also, the present exemplary embodiment is a modified embodiment of FIG. 10 or FIG. 14. Descriptions of features that are already described with reference to FIGS. 10 and 14 and applied to the present exemplary embodiment will not be repeated.

In operation S310, a command and an address are received from the memory controller. According to the present exemplary embodiment, the command may include a program command.

In operation S330, a string selection line voltage or a ground selection line voltage is adjusted to a negative level according to loop information. In an exemplary embodiment, the voltage controller 121a may adjust the string selection line voltage or the ground selection line voltage to a negative level based on the loop information.

According to the present exemplary embodiment, according to a program loop, the voltage controller 121a may determine whether to apply a negative voltage to a gate of a string selection line or ground selection line, or, determine a level of a voltage applied to the gate of the string selection line or ground selection line. For example, according to the program loop, the negative voltage may not be applied to the gate of the string selection line or ground selection line at first, but may be applied thereto later on. Examples of this will be described with reference to FIGS. 21A to 21G.

In operation S350, a program operation related to a memory cell array is performed.

FIGS. 21A to 21G are graphs illustrating various examples of a voltage applied to a selection transistor according to a program loop, according to an exemplary embodiment.

Referring to FIGS. 21A to 21G, a horizontal axis represents a loop count, and a vertical axis represents voltage. FIGS. 21A to 21G may illustrate a voltage of at least one of a plurality of ground selection lines connected to a string or at least one of a plurality of string selection lines included in a string (hereinafter, referred to as 'selection line').

Figure 21A:
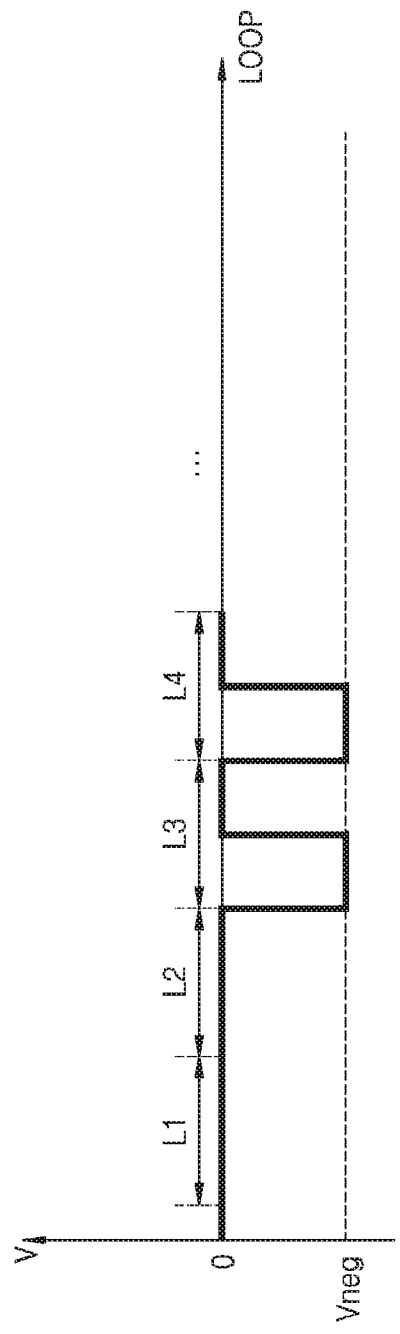
FIGS. 21A to 21G are graphs illustrating various examples of a voltage applied to a selection transistor according to a program loop, according to an exemplary embodiment.

Referring to FIG. 21A, a voltage of a selection line in first and second loops L1 and L2 may be 0V, and a voltage of the selection line in a program execution section of each loop in a third loop L3 and following loops may be a negative voltage Vneg. In an initial loop of a program operation, a program voltage applied to a selected word line may not be high, and a pass voltage applied to a non-selected word line may also not be high. Accordingly, since a boosting potential in a channel area of a string is not high, a negative voltage may not be applied to the selection line. Therefore, according to the present exemplary embodiment, when a loop count is the same as or greater than at threshold value (e.g., 3), the negative voltage Vneg may be applied to the selection line.

Figure 21B:
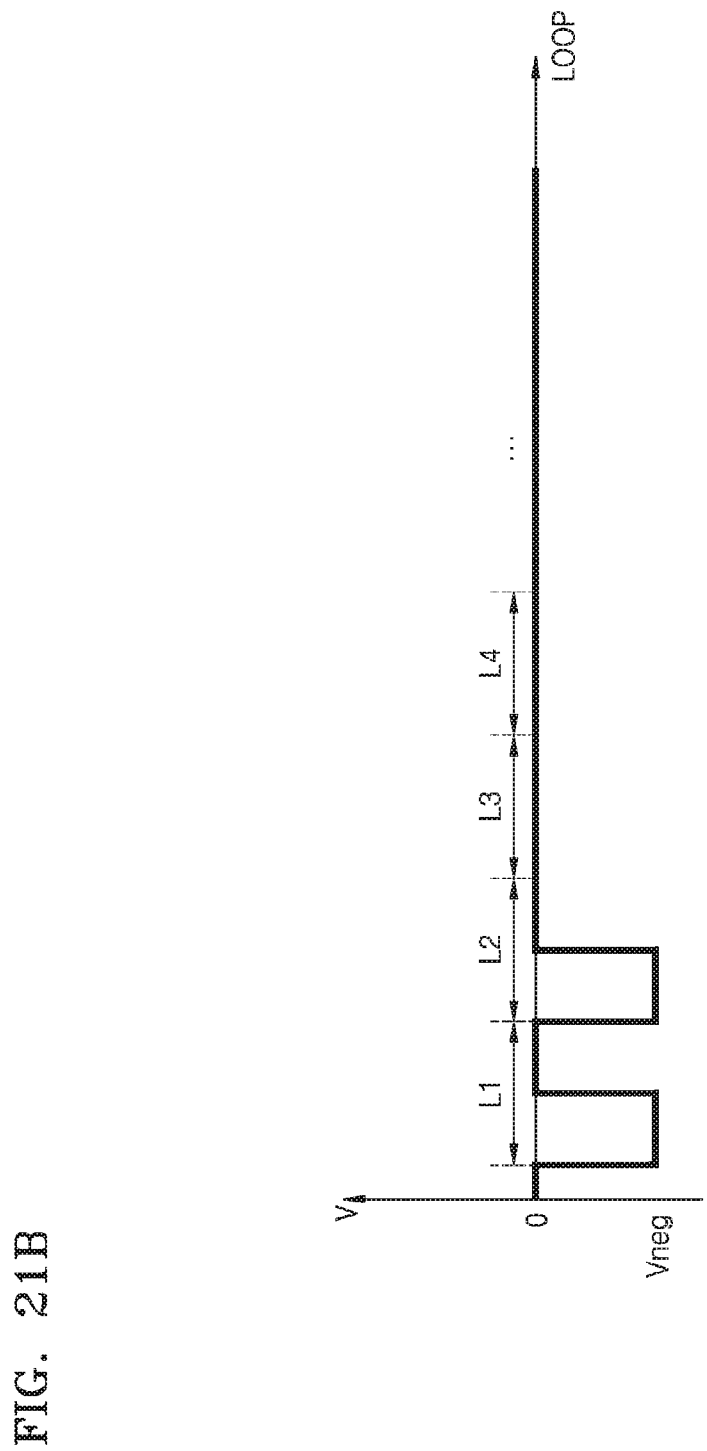

In FIG. 21B, voltages of a selection line in respective program execution sections of first and second loops L1 and L2 may be a negative voltage Vneg, and voltages of the selection line in a third loop L3 and following loops may be 0V. As a loop of a program operation increases, a program voltage applied to a selected word line may gradually increase and a pass voltage applied to a non-selected word line may also increase. Accordingly, a boosting potential in a channel area of a string may be high. In this case, when the negative voltage Vneg is applied to the selection line, a slope of a potential may increase and cause band-to-band tunneling at an edge of the string or leakage current may occur in a selection transistor in the form of a GIDL phenomenon. Therefore, according to the present exemplary embodiment, when a loop count is the same as or greater than at threshold value (e.g., 3), the negative voltage Vneg may not be applied to the selection line.

Figure 21C:
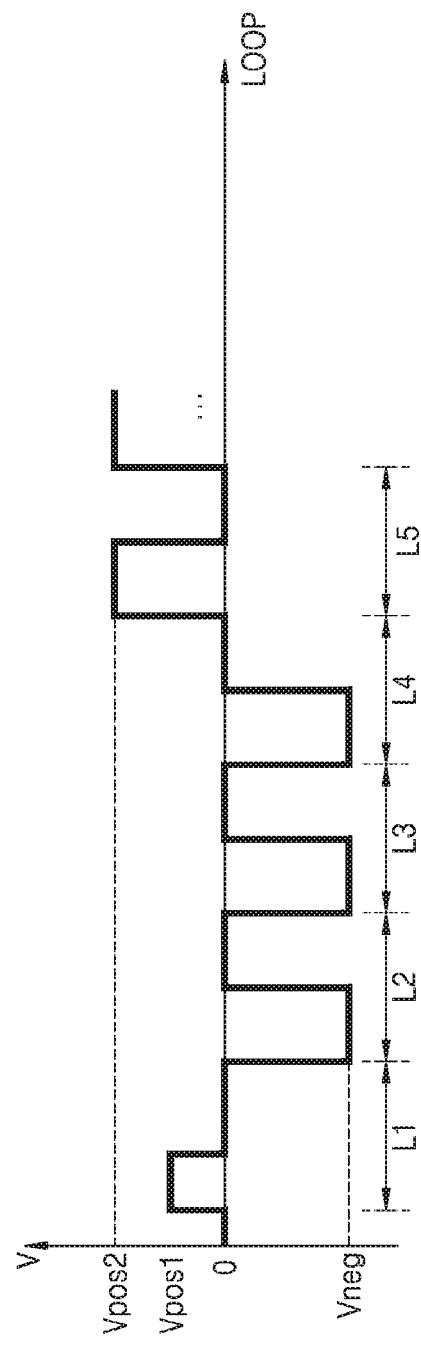

In FIG. 21C, a voltage of a selection line in a program execution section of a first loop L1 is a first positive voltage Vpos1 that is the same as or lower than a threshold voltage of a selection transistor, voltages of the selection line in respective program execution sections of second to fourth loops L2 to L4 may be a negative voltage Vneg, and voltages of the selection line in a fifth loop L5 and following loops may be a second positive voltage Vpos2 that is the same as or lower than a threshold voltage of the selection transistor. In this case, a voltage of the selection line in respective program verification sections of the first to fifth loops L1 to L5 may be 0V.

Although FIG. 21C illustrates that the second positive voltage Vpos2 is greater than the first positive voltage Vpos1, the exemplary embodiments are not limited thereto. According to an exemplary embodiment, the second positive voltage Vpos2 may be the same as or lower than first positive voltage Vpos1.

Figure 21D:
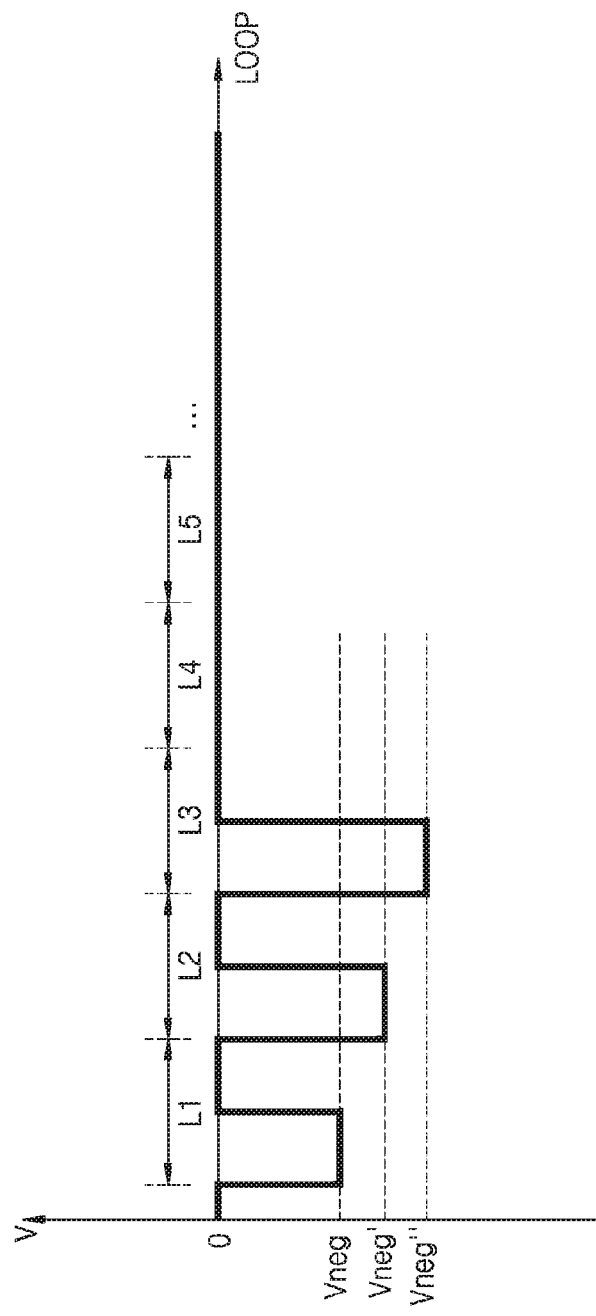

In FIG. 21D, a voltage of a selection line in respective program execution sections of first to third loops L1 to L3 may have a negative level and gradually decrease, and voltages of the selection line in a fourth loop L4 and following loops may be 0V. According to the present exemplary embodiment, the voltage of the selection line in the program execution section of the first loop L1 may have a first negative level Vneg, the voltage of the selection in the program execution section of the second loop L2 may have a second negative level Vneg' that is lower than the first negative level Vneg, and the voltage of the selection line in the program execution section of the third loop L3 may have a third negative level Vneg" that is lower than the second negative level Vneg'.

However, the exemplary embodiments are not limited thereto. According to an exemplary embodiment, the voltages of the selection line in the respective program execution sections of the first to third loops L1 to L3 may have a negative level and gradually decrease, and the voltages of the selection line in the fourth loop L4 and the following loops may have a constant negative level.

Figure 21E:
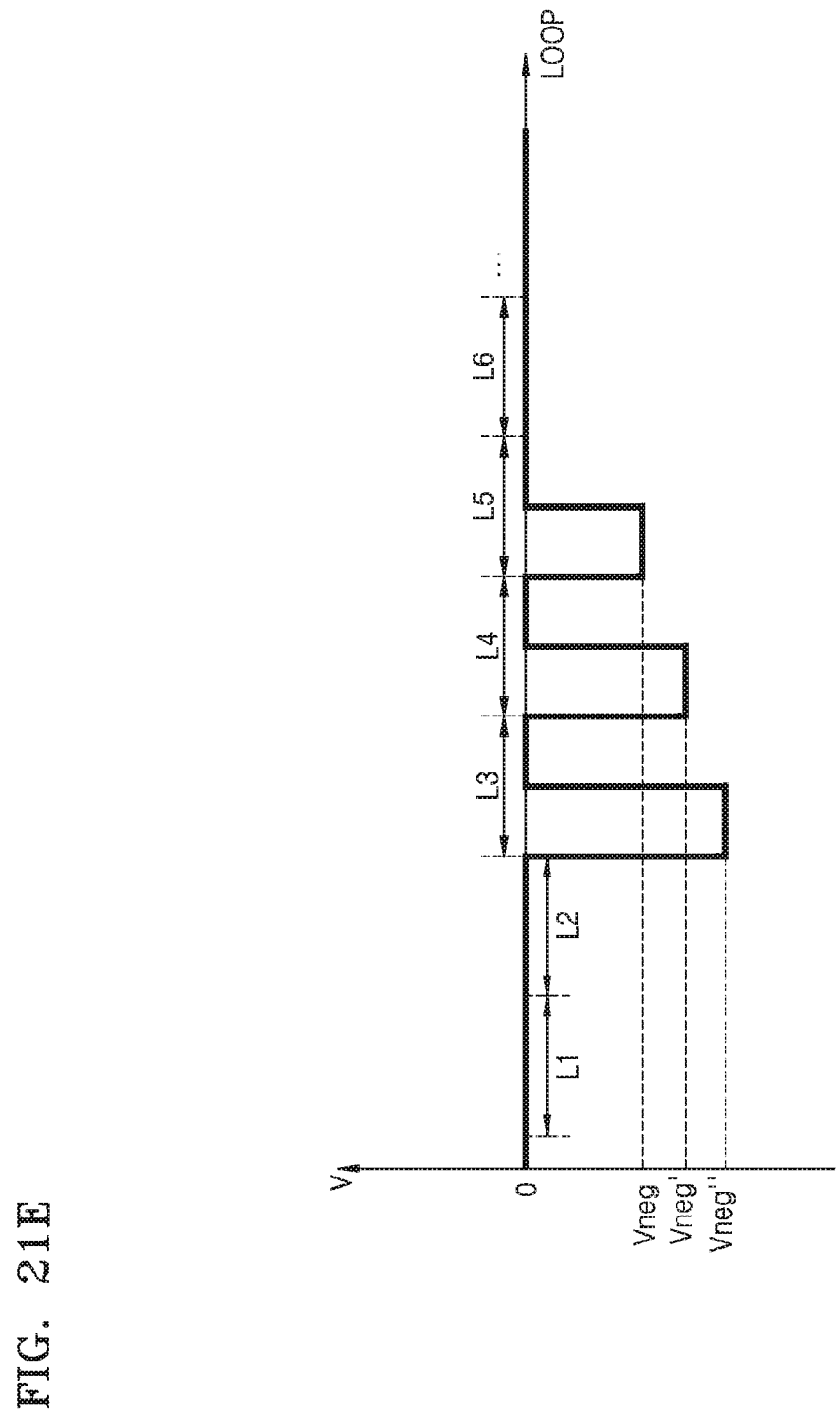

In FIG. 21E, voltages of a selection line in first and second loops L1 and L2 may be 0V, voltages of the selection line in respective program execution sections in third to fifth loops L3 to L5 may have a negative level and gradually increase, and voltages of the selection line in a sixth loop L6 and following loops may be 0V. According to the present exemplary embodiment, the voltage of the selection line in the program execution section of the third loop L3 may have a third negative level Vneg", the voltage of the selection line in the program execution section of the fourth loop L4 may have a second negative level Vneg' that is higher than the third negative level Vneg", and the voltage of the selection line in the program execution section of the fifth loop L5 may have a first negative level Vneg" that is higher than the second negative level Vneg'.

However, the exemplary embodiments are not limited thereto. According to an exemplary embodiment, the voltages of the selection line in the respective program execution sections of the first and second loops L1 and L2 may have a constant negative level, and the voltages of the selection line in the respective program execution sections of the third to fifth loops L3 to L5 may have a negative level and gradually increase.

Figure 21F:
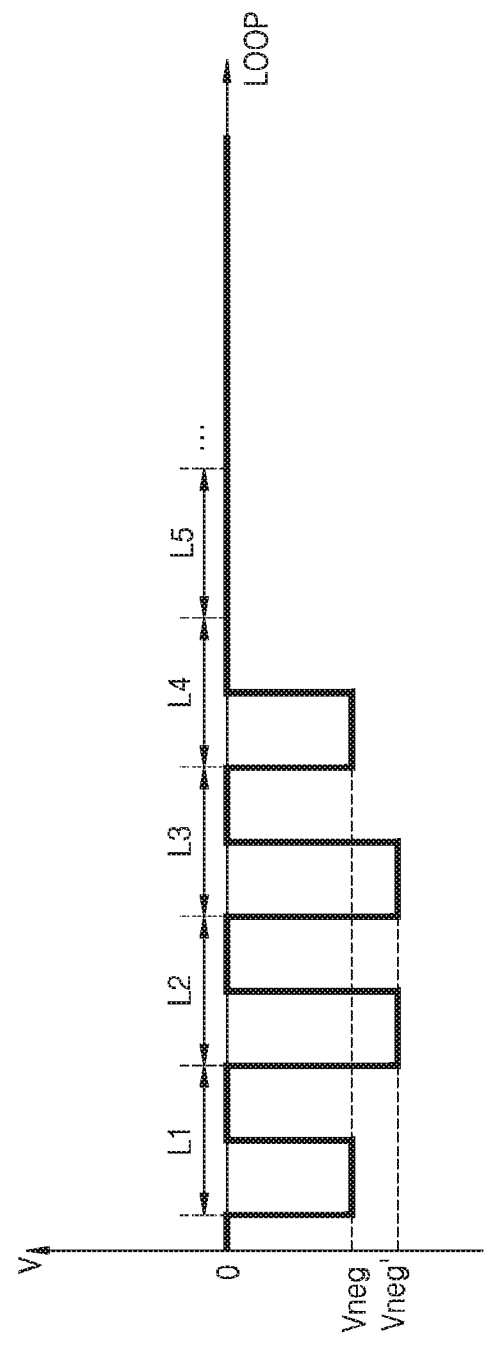

In FIG. 21F, voltages of a selection line in respective program execution sections of first and second loops L1 and L2 may have a negative level and gradually decrease, voltages of the selection line in respective program execution sections of third and fourth loops L3 and L4 may have a negative level and gradually increase, and a voltage of a selection line in fifth loop L5 and following loops may be 0V. According to the present exemplary embodiment, the voltage of the selection line in the program execution section of the first loop L1 may have a first negative level Vneg, the voltages of the selection line in the respective program execution sections of the second and third loops L2 and L3 may have a second negative level Vneg' that is lower than the first negative level Vneg, and the voltage of the selection line in the program execution section of the fourth loop L4 may have the first negative level Vneg that is higher than the second negative level Vneg'.

However, the exemplary embodiments are not limited thereto. According to an exemplary embodiment, the voltages of the selection line in the respective program execution sections of the first and second loops L1 and L2 may have a negative level and gradually decrease, the voltages of the selection line in the respective program execution sections in the third and fourth loops L3 and L4 may have a negative level and gradually increase, and the voltage of the selection line in the fifth loop L5 and the following loops may have a constant negative level.

Figure 21G:
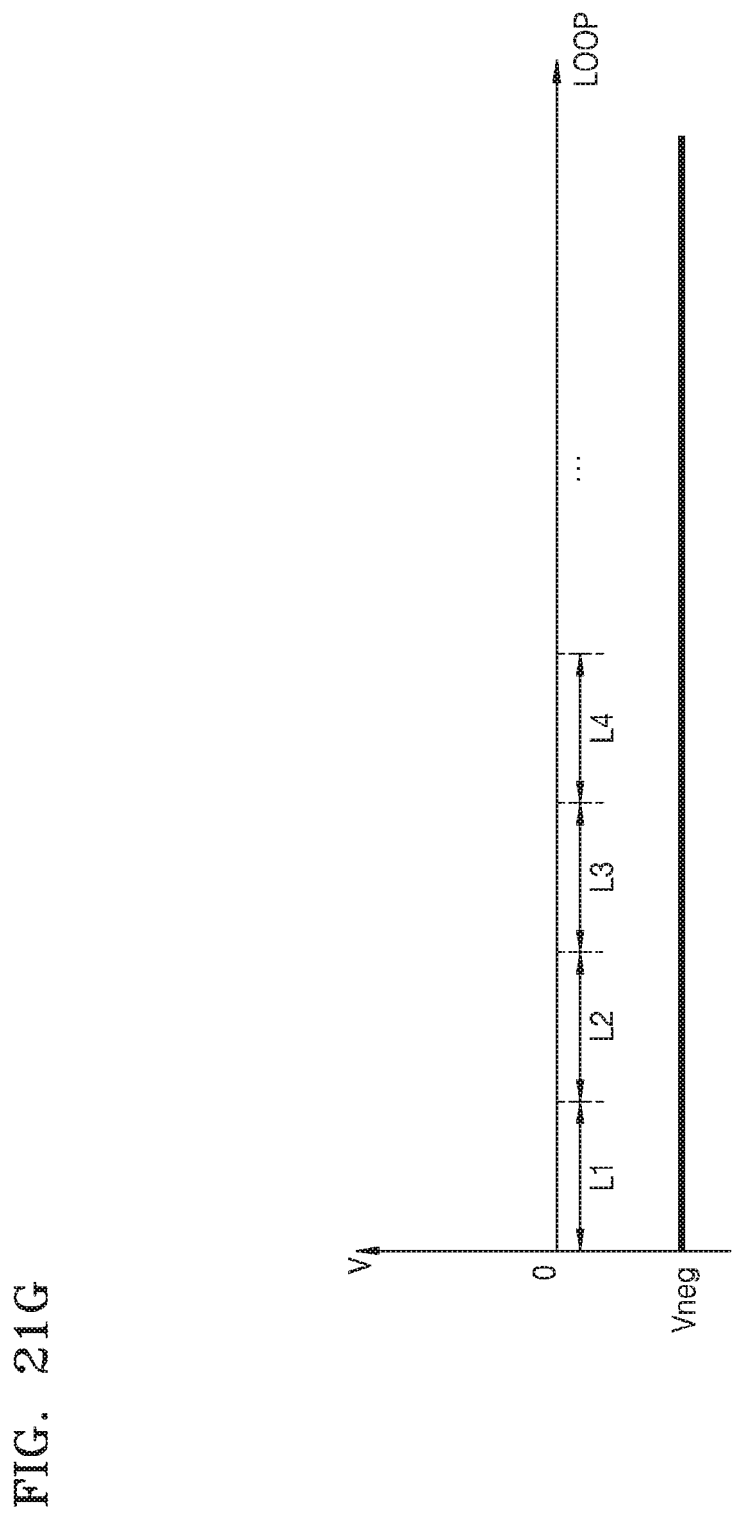

In FIG. 21G, selection line voltages of a non-selected string in respective program execution sections and program verification sections of first to fourth loops L1 to L4 may have a negative level Vneg. During the program execution section, a negative level Vneg is applied to a selection line of the non-selected string to maintain a boosting voltage of the non-selected string, and a bit line voltage that is applied to read data in the program verification section may include the negative level Vneg so that leakage current does not occur via a string of a non-selected block or a non-selected string of a selected block.

However, the exemplary embodiments are not limited thereto. The selection line voltage of the non-selected string in the program execution section may have a different negative voltage level from the selection line voltage of the non-selected string in the program verification section. Also, a selection line voltage of a non-selected string may also have a negative voltage level in an erase verification section or a data read operation section. The erase verification may be similar to program verification.

Figure 22:
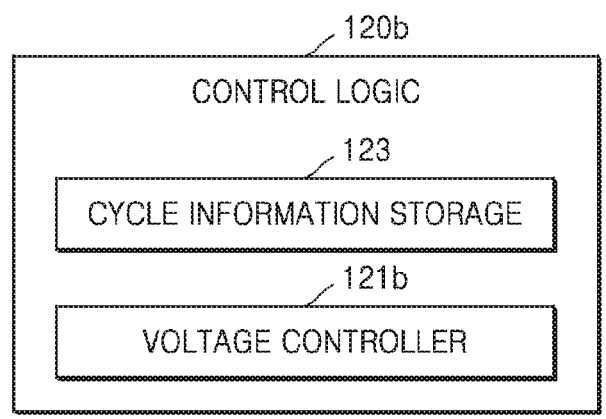
FIG. 22 is a block diagram of another example of the control logic of FIG. 2, according to an exemplary embodiment.

FIG. 22 is a block diagram of another example of the control logic 120 of FIG. 2, according to an exemplary embodiment.

Referring to FIG. 22, a control logic 120b may include a voltage controller 121b and a cycle information storage unit 123. The control logic 120b according to the present exemplary embodiment is a modified embodiment of the control logic 120 of FIG. 2. In comparison to the control logic 120 of FIG. 2, the control logic 120b may further include the cycle information storage unit 123.

Since the 3D memory device is a string with no bulk, the 3D memory device has a higher boosting potential than the 2D memory device. Therefore, since potential differences between adjacent cells are large, band-to-band tunneling disturb may easily occur. Also, the 3D memory device includes a polysilicon channel instead of a monocrystal silicon channel. A relatively large amount of leakage current via grain boundaries may occur in polysilicon. Therefore, when leakage current through a bit line or a common source line is injected into a dummy cell, a string selection transistor, or a ground selection transistor due to a boosting potential by hot carrier injection (HCI), a threshold voltage of the dummy cell, the string selection transistor, or the ground selection transistor may increase. Due to the increase, the dummy cell, the string selection transistor, or the ground selection transistor may deteriorate.

Therefore, a threshold voltage of a dummy cell or a selection transistor in a block in which a program/erase cycle is repeated or a block that experienced a read cycle several times may change. Accordingly, a boosting potential may rapidly change at an edge area of a string. As described above, the rapid change of the boosting potential may cause band-to-band tunneling. Thus, the control logic 120b according to the present exemplary embodiment may include the cycle information storage unit 123, and control a voltage of a dummy line, a string selection line, or a ground selection line based on cycle information.

The cycle information storage unit 123 may store information about an operation cycle count of memory cells in the memory cell array 110. According to an exemplary embodiment, the cycle information storage unit 123 may store information about a program/erase cycle count that represents the number of program/erase cycles. According to an exemplary embodiment, the cycle information storage unit 123 may store information about a read cycle count that represents the number of read cycles. The cycle information storage unit 123 may be provided as a latch or a register. According to an exemplary embodiment, cycle information may be stored in an area of the memory cell array 110. According to an exemplary embodiment, the cycle information may be stored in a buffer memory of a memory controller.

The voltage controller 121b may generate the voltage control signal CTRL_vol such that a string selection line voltage or a ground selection line voltage changes according to a cycle count. Also, the voltage controller 121b may generate the voltage control signal CTRL_vol such that a dummy line voltage changes according to the cycle count.

However, the exemplary embodiments are not limited thereto. According to some exemplary embodiments, when a fail bit in memory cells located in a central area of a string exceeds a reference parameter, the voltage controller 121b may generate the voltage control signal CTRL_vol such that a string selection line voltage, a ground selection line voltage, or a dummy line voltage changes. According to some exemplary embodiments, when a measured value of a threshold voltage of the dummy cell, the string selection transistor, or the ground selection transistor exceeds a reference range, the voltage controller 121b may generate the voltage control signal CTRL_vol such that the string selection line voltage, the ground selection line voltage, or the dummy line voltage changes.

According to an exemplary embodiment, the voltage controller 121b may generate the voltage control signal CTRL_vol such that a string selection line voltage applied to a non-selected string selection line connected to a non-selected memory cell has a negative level in a program section or read section and a string selection line voltage changes according to a cycle count. According to some exemplary embodiments, the voltage controller 121b may generate the voltage control signal CTRL_vol such that the string selection line voltage has a negative level in at least a portion of the program section or the read section and the string selection line voltage changes according to the cycle count.

According to an exemplary embodiment, the voltage controller 121b may generate the voltage control signal CTRL_vol such that a ground selection line voltage applied to a non-selected ground selection line connected to a non-selected memory cell has a negative level in a program section or a read section and a ground selection line voltage changes according to a cycle count. According to some exemplary embodiments, the voltage controller 121b may generate the voltage control signal CTRL_vol such that the ground selection line voltage has a negative level in at least a portion of the program section or the read section and the ground selection line voltage changes according to a cycle count FIG. 23 is a flowchart of an operation method of a memory device, according to an exemplary embodiment.

Figure 23:
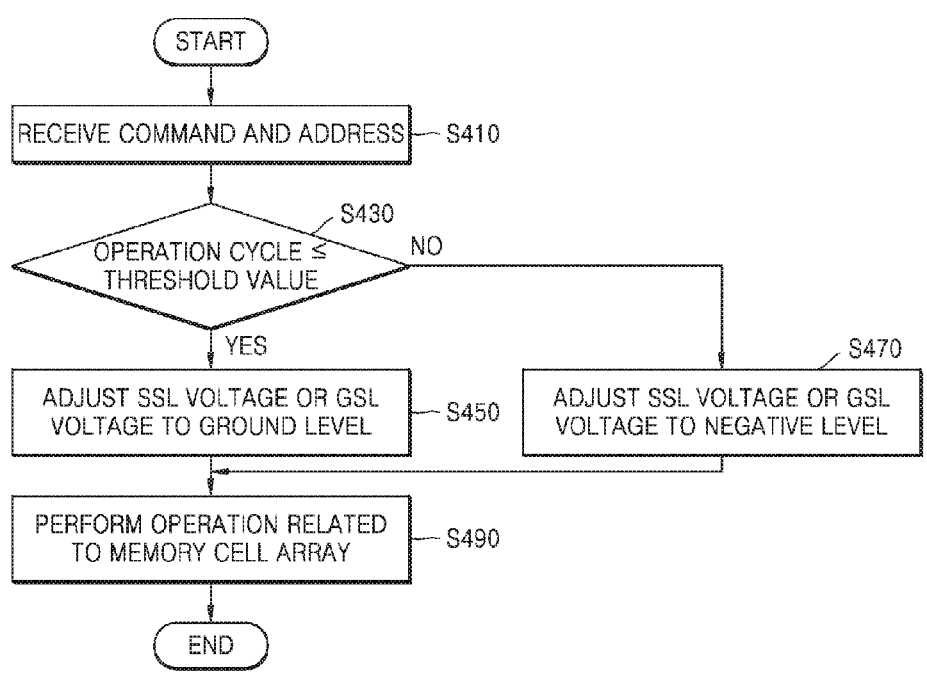
FIG. 23 is a flowchart of an operation method of a memory device, according to an exemplary embodiment.

Referring to FIG. 23, the method according to the present exemplary embodiment is performed by the memory device when a command and an address are received from a memory controller. For example, the method may include operations sequentially performed in a memory device including the control logic 120b of FIG. 22. The present exemplary embodiment is a modified exemplary embodiment of the methods of FIG. 10, 14, or 20. Descriptions of features that are already described with reference to FIGS. 10, 14, and 20 and applied to the present exemplary embodiment will not be repeated.

In operation S410, a command and an address are received from the memory controller. According to an exemplary embodiment, the command may include a program command. According to an exemplary embodiment, the command may include a read command.

In operation S430, whether an operation cycle is the same as or lower than a threshold value is determined. According to a result of the determination, operation S450 is performed when the operation cycle is the same as or lower than a threshold value, and if not, operation S470 is performed. However, the exemplary embodiments are not limited thereto. According to an exemplary embodiment, operation S430 may determine whether the operation cycle is lower than the threshold value. In this case, operation S450 may be performed when the operation cycle is lower than the threshold value, and if not, operation S470 may be performed.

In operation S450, a string selection line voltage or a ground selection line voltage is adjusted to a ground level. This will be described below with reference to FIG. 24A. In operation S470, the string selection line voltage or the ground selection line voltage is adjusted to a negative level. This will be described below with reference to FIG. 24B. In operation S490, an operation related to a memory cell array is performed. According to an exemplary embodiment, a program operation related to the memory cell array may be performed. According to an exemplary embodiment, a read operation related to the memory cell array may be performed. Accordingly, according to the present exemplary embodiment, a voltage of a selection line may be adjusted according to an operation cycle.

Figure 24A:
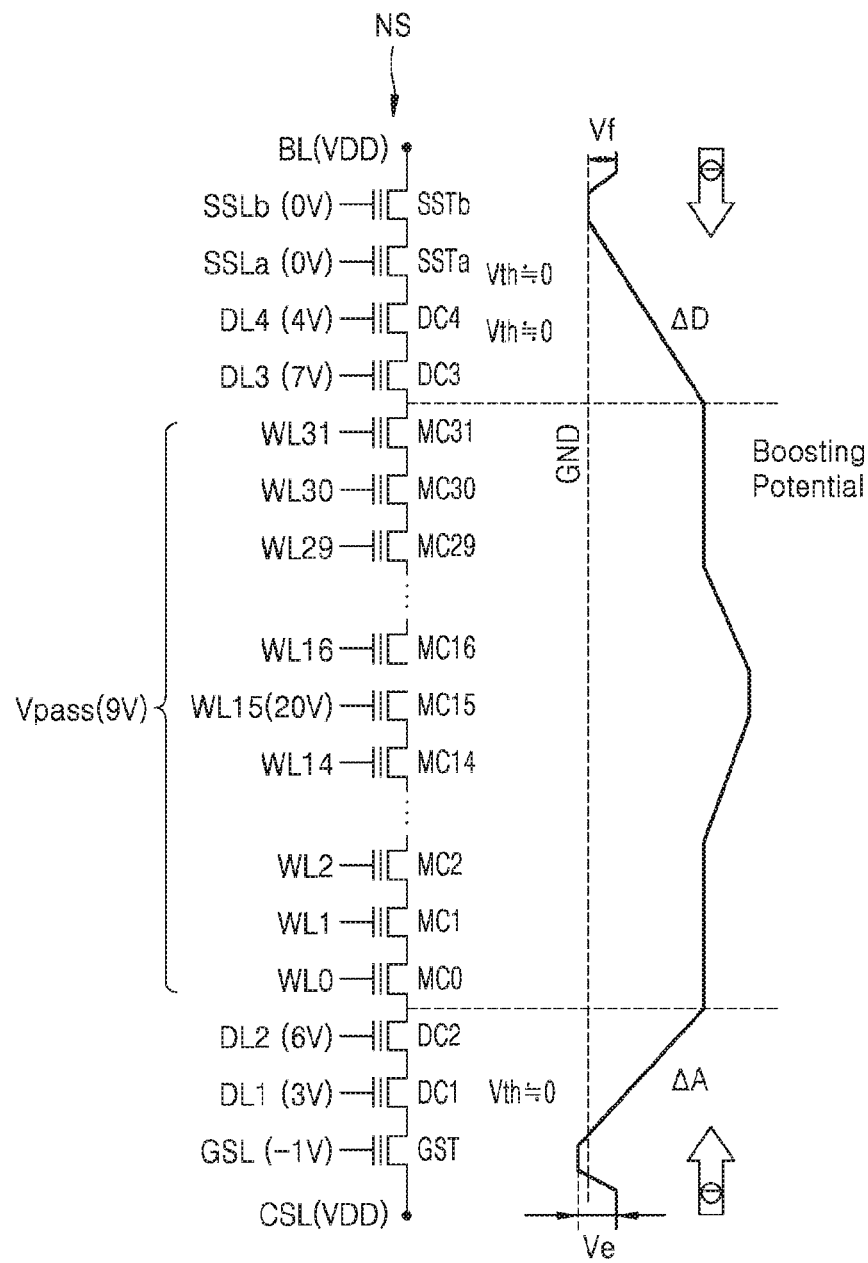
FIGS. 24A and 24B illustrate program bias conditions and boosting potentials based on the program bias conditions, according to an exemplary embodiment.
Figure 24B:
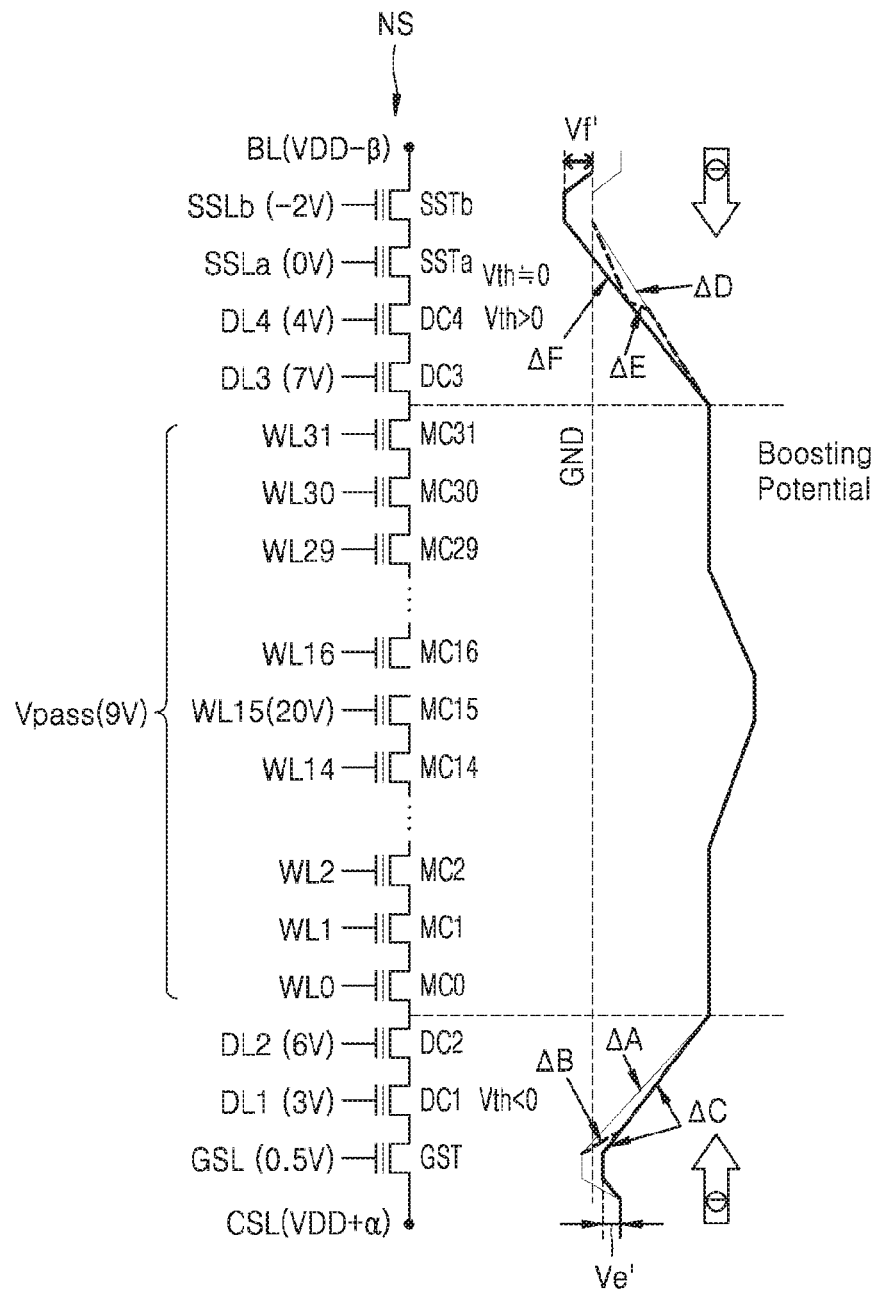

FIGS. 24A and 24B illustrate program bias conditions and boosting potentials based on the program bias conditions, according to an exemplary embodiment. In an exemplary embodiment, FIG. 24A illustrates a program bias condition and a boosting potential according to the program bias condition when an operation cycle is the same as or lower than a threshold value, and FIG. 24B illustrates a program bias condition and a boosting potential according to the program bias condition when an operation cycle is greater than a threshold value.

Referring to FIG. 24A, a string NS may include a ground selection transistor GST, a plurality of memory cells MC0 to MC31, and a plurality of string selection transistors SSTa and SSTb. Dummy cells DC1 and DC2 may be located between the ground selection transistor GST and the memory cells MC0 to MC31, and dummy cells DC3 and DC4 may be located between the memory cells MC0 to MC31 and the string selection transistors SSTa and SSTb. However, the exemplary embodiments are not limited thereto. The number of ground selection transistors, memory cells, dummy cells, or string selection transistors may vary according to exemplary embodiments.

The string NS may be a non-selected string connected to a non-selected string selection line SSL and a non-selected bit line BL. The string NS may correspond to, for example, the string NS12 of FIG. 12. Therefore, the string selection transistors SSTa and SSTb and the ground selection transistor GST may be turned off, and a power voltage VDD may be applied to a bit line BL and a common source line CSL. Also, a channel area may be floated by a pass voltage Vpass (e.g., 9V) applied to non-selected word lines and a program voltage Vpgm (e.g., 20V) applied to a selected word line (e.g., WL15) and maintain a boosting potential.

According to the present exemplary embodiment, when an operation cycle is the same as or lower than a threshold value, respective threshold voltages of the dummy cells DC1 to DC4 and the string selection transistor SSTa may be a threshold voltage after processing that is near 0V. For example, 0V may be applied to string selection lines SSLa and SSLb, and −1V may be applied to a ground selection line GSL. Therefore, a potential difference Ve between the common source line CSL and the ground selection transistor GST may be greater than a potential difference VF between the bit line BL and the string selection transistor SSTb.

According to the present exemplary embodiment, a slope ΔA of a potential in a lower edge area of the string NS, i.e., from the dummy cell DC2 to the ground selection transistor GST may be greater that a slope ΔD of a potential in an upper edge area of the string NS, i.e., from the dummy cell DC3 to the string selection transistor SSTb.

Referring to FIG. 24B, according to the present exemplary embodiment, when the operation cycle is greater than the threshold value, the threshold voltage of the dummy cell DC1 may decrease and be lower than 0V. For example, when the program operation is not performed but only the erase operation is repeated for the dummy cell DC1, the threshold voltage of the dummy cell DC1 may decrease.

When 3V is applied to a dummy line DL1 as in an initial cycle stage, a boosting potential corresponding to the dummy line DL1 further increases. Alternatively, when −1V is applied to the ground selection line GSL as in the initial cycle stage, a slope ΔB of a boosting potential from the dummy cell DC2 to the ground selection transistor GST is greater than the slope ΔA of FIG. 24A, which may cause band-to-band tunneling in a lower edge area of the string NS.

According to the present exemplary embodiment, a voltage of a ground selection line GSL may be increased to a positive level (e.g., 0.5V), and accordingly, a slope ΔC of a boosting potential from the dummy cell DC2 to the ground selection transistor GST may become more gradual. Thus, band-to-band tunneling may be prevented from occurring in the lower edge area of the string NS, and program disturb of the string NS may be prevented.

Furthermore, according to the present exemplary embodiment, the voltage of the common source line CSL may be increased. In an exemplary embodiment, the voltage, i.e., the power voltage VDD, may be increased by a predetermined value α. The predetermined value α may correspond to, for example, a voltage increase level of the ground selection line GSL. Thus, a voltage difference Ve' between the ground selection line GSL and the common source line CSL may be substantially the same as Ve of FIG. 24A (i.e., |Ve|≈|Ve'|). Accordingly, by increasing a source voltage of the ground selection transistor GST as a gate voltage of the ground selection transistor GST increases, an off current of the ground selection transistor GST may be adjusted and be the same as or lower than an off current limit.

However, when the operation cycle is greater than the threshold value, the threshold voltage of the dummy cell DC4 may increase and be greater than 0V. For example, as a program/erase cycle or a read cycle is repeated for the string NS, the threshold voltage of the dummy cell DC4 may gradually increase due to band-to-band tunneling or HCI in a channel during programming or reading.

When 4V is applied to the dummy line DL4 as in the initial cycle stage, a boosting potential corresponding to the dummy line DL4 decreases more. Alternatively, when 0V is applied to the string selection line SSLb as in the initial cycle stage, a slope ΔE of a boosting potential in the dummy cell DC4 sharply increases, which may cause band-to-band tunneling in an upper edge area of the string NS.

According to the present exemplary embodiment, the voltage of the string selection line SSLb may be decreased to a negative level (e.g., −2V), and accordingly, a slope ΔF of a boosting potential from the dummy cell DC3 to the string selection transistor SSTb may become more gradual. Thus, band-to-band tunneling may be prevented from occurring in the upper edge area of the string NS, and program disturb of the string NS may be prevented.

Furthermore, according to the present exemplary embodiment, the voltage of the bit line BL may be decreased. In an exemplary embodiment, the voltage, i.e., the power voltage VDD, may be decreased by a predetermined value β. The predetermined value β may correspond to, for example, a voltage decrease level of the string selection line SSLb. Thus, a voltage difference Vf' between the string selection line SSLb and the bit line BL may be substantially the same as Vf of FIG. 24A (i.e., |Vf|≈|Vf'|). Accordingly, by decreasing a source voltage of the string selection transistor SSTb as a gate voltage of the ground selection transistor SSTb decreases, an off current of the string selection transistor SSTb may be adjusted and be the same as or lower than an off current limit.

However, the exemplary embodiments are not limited thereto. According to some exemplary embodiments, a threshold voltage of a dummy cell located at a lower edge of the string NS may increase as the operation cycle increases. In this case, the voltage of the ground selection line GSL may be further decreased and the voltage of the common source line CSL may also be decreased. Alternatively, according to some exemplary embodiments, a threshold voltage of a dummy cell located at an upper edge of the string NS may decrease as the operation cycle increases. In this case, the voltage of the string selection line SSLb may be further increased, and the voltage of the bit line BL may also be increased.

According to an exemplary embodiment, the threshold voltage of the ground selection transistor GST may increase as the operation cycle increases. In this case, the voltage of the ground selection line GSL may be increased. According to some exemplary embodiments, the threshold voltage of the ground selection transistor GST may decrease as the operation cycle decreases. In this case, the voltage of the ground selection line GSL may be further decreased.

According to an exemplary embodiment, a threshold voltage of at least one of the string selection transistors SSTa and SSTb may increase as the operation cycle increases. In this case, a voltage of a corresponding string selection line may be further increased. According to some exemplary embodiments, the threshold voltage of at least one of the string selection transistors SSTa and SSTb may decrease as the operation cycle decreases. In this case, a voltage of a corresponding string selection line may be further decreased.

Therefore, according to the present exemplary embodiment, based on changes in the threshold voltage due to deterioration of dummy cells, string selection transistors, and ground selection transistors according to the increase of the operation cycle, the voltage of the string selection lines SSLa and SSLb or the voltage of the ground selection line GSL may be adaptively changed. Therefore, leakage current of the string NS may be reduced and program disturb may be reduced or eliminated.

Figure 25:
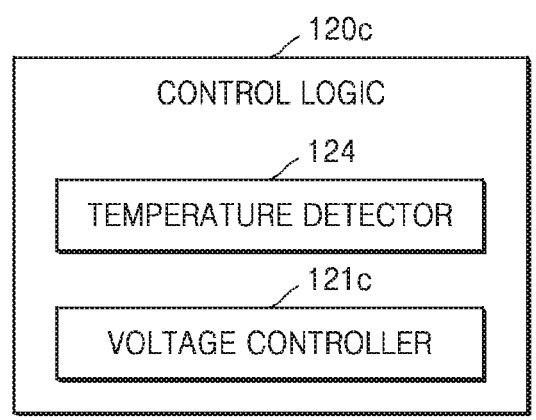
FIG. 25 is a block diagram of another example of the control logic of FIG. 2, according to an exemplary embodiment.

FIG. 25 is a block diagram of another example of the control logic 120 of FIG. 2, according to an exemplary embodiment.

Referring to FIG. 25, a control logic 120c may include a voltage controller 121c and a temperature detector 124. The control logic 120c according to the present exemplary embodiment is a modified exemplary embodiment of the control logic 120 of FIG. 2. In comparison to the control logic 120 of FIG. 2, the control logic 120c may further include the temperature detector 124.

As temperature decreases, respective threshold voltages of a string selection transistor and a ground selection transistor may increase. Therefore, respective voltages of a string selection line and a ground selection line that are respectively connected to the string selection transistor and the ground selection transistor may be adjusted with respect to the change of the threshold voltages.

According to the present exemplary embodiment, the temperature detector 124 may detect an inner temperature or surrounding temperature of the memory device 100. The voltage controller 121c may generate the voltage control signal CTRL_vol such that a string selection line voltage or a ground selection line voltage changes according to the detected temperature. Alternatively, the voltage controller 121c may generate the voltage control signal CTRL_vol such that a dummy line voltage or a word line voltage changes according to the detected temperature.

According to an exemplary embodiment, the voltage controller 121c may generate the voltage control signal CTRL_vol such that a string selection line voltage applied to a non-selected string selection line connected to a non-selected memory cell has a negative level and changes according to temperature, in a program section or a read section. According to an exemplary embodiment, the voltage controller 121c may generate the voltage control signal CTRL_vol such that the string selection line voltage has a negative level and changes according to temperature, in at least a portion of the program section or at least a portion of the read section.

According to an exemplary embodiment, the voltage controller 121c may generate the voltage control signal CTRL_vol such that a ground selection line voltage applied to a non-selected ground selection line connected to a non-selected memory cell has a negative level and changes according to temperature, in a program section or a read section. According to an exemplary embodiment, the voltage controller 121c may generate the voltage control signal CTRL_vol that has a negative level and changes according to temperature, in at least a portion of the program section or at least a portion of the read section.

Figure 26:
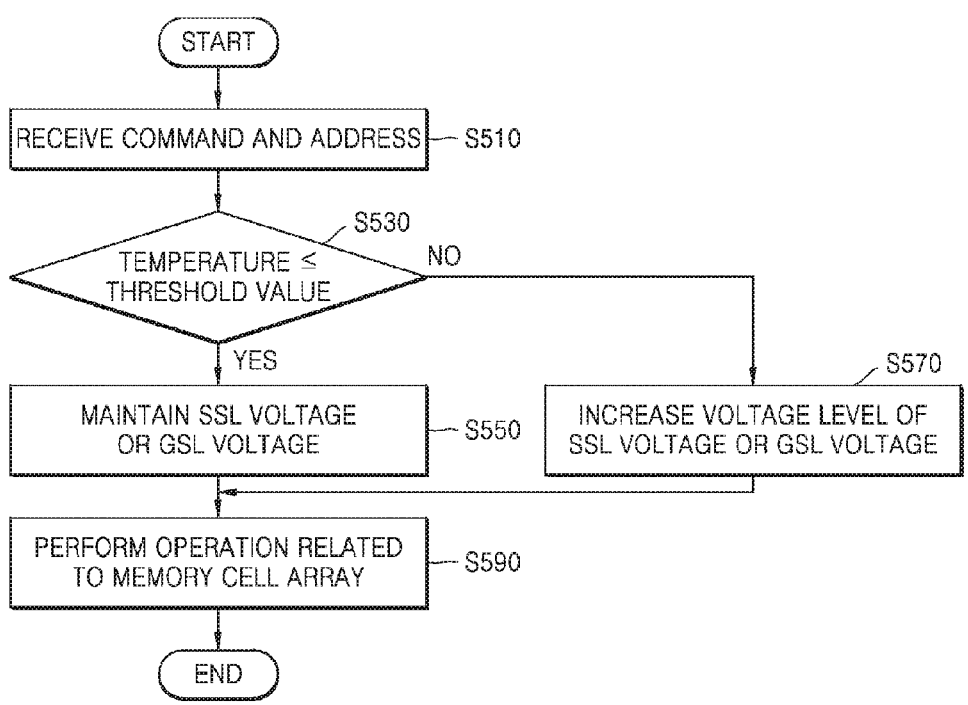
FIG. 26 is a flowchart of an operation method of a memory device, according to an exemplary embodiment.

FIG. 26 is a flowchart of an operation method of a memory device, according to an exemplary embodiment.

Referring to FIG. 26, the method according to the present exemplary embodiment is performed by the memory device when a command and an address are received from a memory controller. For example, the method may include operations sequentially performed in a memory device including the control logic 120c of FIG. 25. The present exemplary embodiment is a modified exemplary embodiment of the methods of FIG. 10, 14, 20, or 23. Descriptions of features that are already described with reference to FIGS. 10, 14, 20, and 23 and applied to the present exemplary embodiment will not be repeated.

In operation S510, a command and an address are received from the memory controller. According to an exemplary embodiment, the command may include a program command. According to an exemplary embodiment, the command may include a read command.

In operation S530, whether temperature is the same as or lower than a threshold value is determined. According to a result of the determination, operation S550 is performed when the temperature is the same as or lower than the threshold value, and if not, operation S570 is performed. However, the exemplary embodiments are not limited thereto. According to some exemplary embodiments, operation S530 may determine whether the temperature is lower than the threshold value. In this case, operation S550 may be performed when the temperature is lower than the threshold value, and if not, operation S570 may be performed.

In operation S550, a string selection line voltage or a ground selection line voltage is maintained. In operation S570, a voltage level of the string selection line voltage or the ground selection line voltage is increased. In operation S590, an operation related to a memory cell array is performed. According to an exemplary embodiment, a program operation related to the memory cell array may be performed. According to some exemplary embodiments, a read operation related to the memory cell array may be performed.

Figure 27:
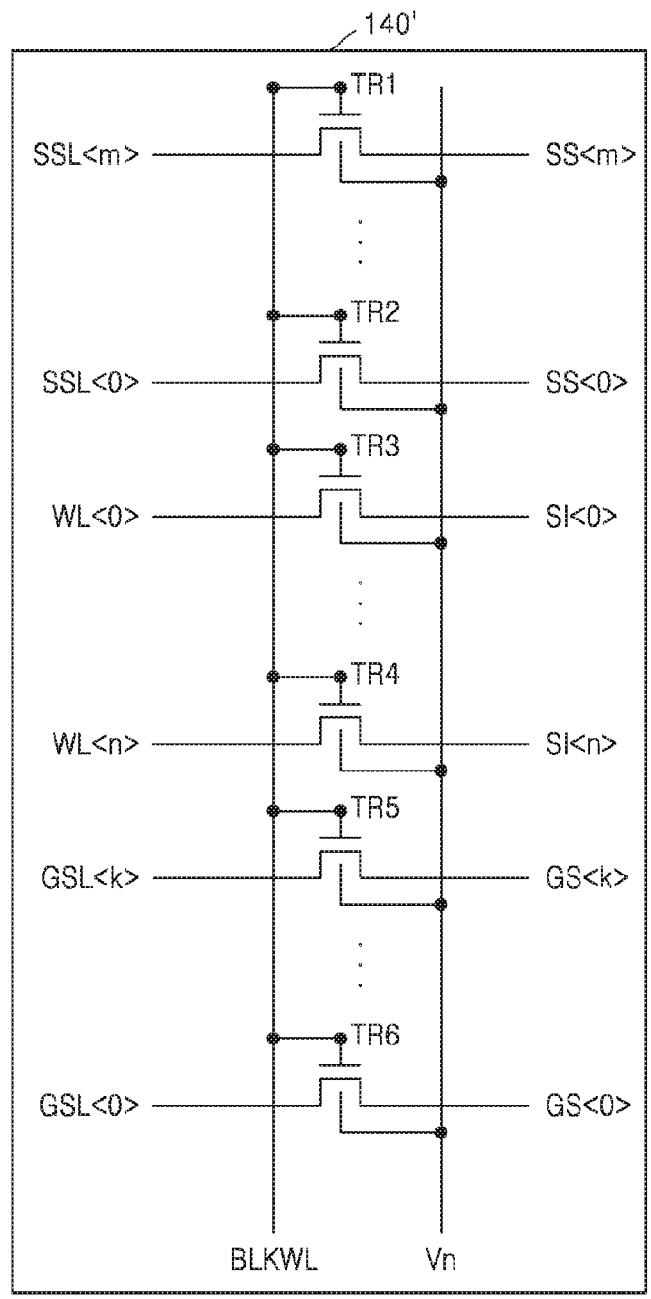
FIG. 27 is a circuit diagram of an example of a row decoder of FIG. 2.

FIG. 27 is a circuit diagram that illustrates an example of a row decoder of FIG. 2.

Referring to FIG. 27, a row decoder 140' may include a plurality of pass transistors TR1 to TR6 that are turned on/off according to a block word line voltage BLKWL. The block word line voltage BLKWL may be a voltage corresponding to a block word line that is selected according to the row address X-ADDR.

The string selection line pass transistors TR1 and TR2 may be controlled by the block word line voltage BLKWL and apply a string selection line voltage SS to string selection lines SSL. The word line pass transistors TR3 and TR4 may be controlled by the block word line voltage BLKWL and apply a word line voltage SI to word lines WL. The ground selection line pass transistors TR5 and TR6 may be controlled by a block word line voltage BLKWL and apply a ground selection line voltage GS to ground selection lines GSL.

Figure 28A:
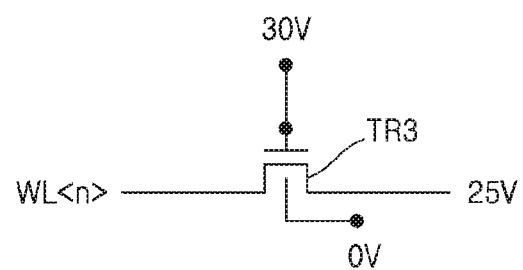
FIG. 28A is a circuit diagram of an example of a program bias condition of a word line pass transistor of FIG. 27.

FIG. 28A is a circuit diagram of an example of a program bias condition of a word line pass transistor of FIG. 27.

Referring to FIG. 28A, the word line voltage SI may be determined according to a program voltage. For example, when the program voltage is 25V, the word line voltage SI may be 25V. When a body voltage is 0V, a source-body voltage Vsb is 25V, and a threshold voltage of the word line pass transistor TR3 increases due to a body effect.

For a gate-source voltage Vgs to be greater than 5V (Vgs>5V) regarding the body effect, the block word line voltage BLKWL has to be increased. However, due to breakdown caused by high voltage or limitations of metal routing, the block word line voltage BLKWL may be limited to about 30V. Therefore, a maximum program voltage applied to a word line may be limited to about 25V.

Figure 28B:
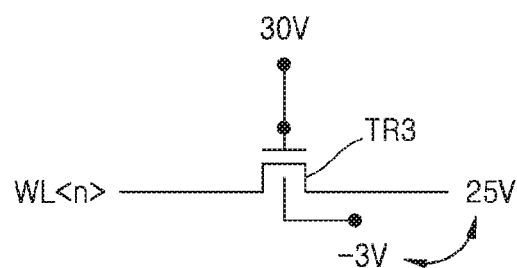
FIG. 28B is a circuit diagram of another example of a program bias condition of a word line pass transistor of FIG. 27.

FIG. 28B is a circuit diagram of another example of a program bias condition of a word line pass transistor of FIG. 27.

Referring to FIG. 28B, when a negative voltage is applied to a string selection line, a string selection line voltage SS may be, for example, −3V. To prevent a short from occurring between a well in which the string selection line pass transistors TR1 and TR2 are formed and a source area to which the string selection line voltage SS is applied, a negative voltage greater than −3V has to be applied to the well. Therefore, Vn may be a negative voltage greater than −3V.

When the string selection line pass transistors TR1 and TR2 and the word line pass transistor TR3 are formed in the same well, a body voltage of the word line pass transistor TR3 may be Vn. Therefore, a source-body voltage Vsb of the word line pass transistor TR3 may be greater than 28V.

Accordingly, a threshold voltage of the word line pass transistor TR3 may further increase.

In this case, even when the block word line voltage BLKWL that is applied to a gate of the word line pass transistor TR3 is 30V, due to the increase of the threshold voltage of the word line pass transistor TR3, a program voltage applied to a word line WL cannot exceed 25V. That is, when a negative bias is applied to prevent program disturb, a level of a maximum program voltage that may be applied to a memory cell decreases.

Figure 28C:
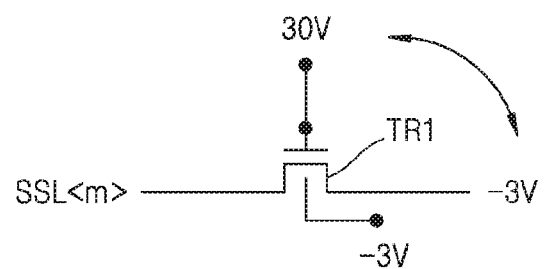
FIG. 28C is a circuit diagram of an example of a bias condition of a string selection line pass transistor of FIG. 27.

FIG. 28C is a circuit diagram of an example of a bias condition of a string selection line pass transistor of FIG. 27.

Referring FIG. 28C, when a negative voltage is applied to the string selection line SSL, the string selection line voltage SS may be, for example, −3V. The block word line voltage BLKWL applied to a gate of the string selection line pass transistor TR1 may be the same as the block word line voltage BLKWL applied to the gate of the word line pass transistor TR3. For example, the block word line voltage BLKWL may be about 30V. Accordingly, a gate-source voltage Vgs of the string selection line pass transistor TR1 may be 33V, and thus, the gate-source voltage Vgs may be greater than a breakdown voltage, and cause physical breakdown between the gate and the source.

Figure 29:
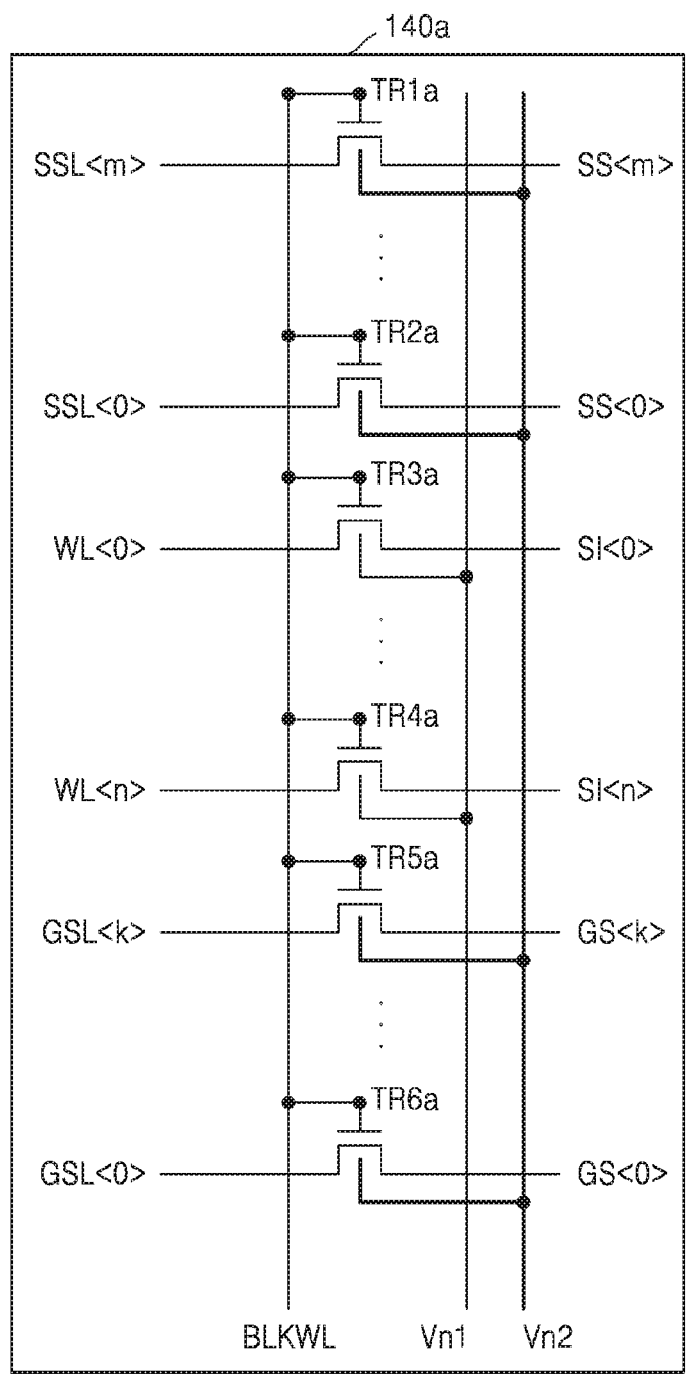
FIG. 29 is a circuit diagram of an example of the row decoder of FIG. 2, according to an exemplary embodiment.

FIG. 29 is a circuit diagram of an example of a row decoder of FIG. 2, according to an exemplary embodiment.

Referring to FIG. 29, a row decoder 140a may include string selection line pass transistors TR1a and TR2a, word line pass transistors TR3a and TR4a, and ground selection line pass transistors TR5a and TR6a. According to the present exemplary embodiment, the word line pass transistors TR3a and TR4a may be located in a first well, and the string selection line pass transistors TR1a and TR2a and the ground selection line pass transistors TR5a and TR6a may be located in a second well. According to the present exemplary embodiment, a first voltage Vn1 is applied to the first well, and a second voltage Vn2 is applied to the second well. The first voltage Vn1 may be different from the second voltage Vn2.

According to an exemplary embodiment, while performing a program operation, a program voltage or a pass voltage may be applied to the word line WL, and a negative voltage may be applied to the string selection line SSL or the ground selection line GSL. The first voltage Vn1 may be greater than the second voltage Vn2. For example, the first voltage Vn1 may be about 0V, and the second voltage Vn2 may be a negative voltage.

For example, when the program voltage is 25V, a source voltage Vs of the word line pass transistor TR3a may be 25V. In this case, since the first voltage Vn1 is 0V, a source-body voltage Vsb of the word line pass transistor TR3a may be 25V, and a threshold voltage of the word line pass transistor TR3a may not increase. Therefore, since the program voltage may be normally applied to a word line, a program operation related to a selected memory cell may be normally performed.

According to an exemplary embodiment, while performing a read operation, when data to be read is smaller than 0V (e.g., erased state), a read voltage applied to a selected word line may have a negative level. In this case, the first voltage Vn1 may be smaller than the second voltage Vn2. For example, the first voltage Vn1 may be a negative voltage, and the second voltage Vn2 may be about 0V.

For example, when the read voltage is −3V, the source voltage Vs of the word line pass transistor TR3a may be −3V. When the first voltage Vn1 is −3V, the source-body voltage Vsb of the word line pass transistor TR3a may be 0V, and the threshold voltage of the word line pass transistor TR3a may not increase. Therefore, since the read voltage may be normally applied to a word line, a read operation related to a selected memory cell may be normally performed.

Therefore, according to the present exemplary embodiment, to apply the negative bias to the string selection line SSL or the ground selection line GSL during the program operation, the string selection line pass transistors TR1a and TR2a and the ground selection line pass transistors TR5a and TR6a may be formed in the second well to which the negative voltage may be applied. Thus, the negative voltage may be applied to respective bodies of the string selection line pass transistors TR1a and TR2a and the ground selection line pass transistors TR5a and TR6a.

Also, according to the present exemplary embodiment, for the threshold voltage of the word line pass transistors TR3a and TR4a to not increase due to a body effect during the program operation, the word line pass transistors TR3a and TR4a may be formed in the first well that is spaced apart from the second well. Thus, the problem stated with reference to FIG. 28B may be solved.

Figure 30:
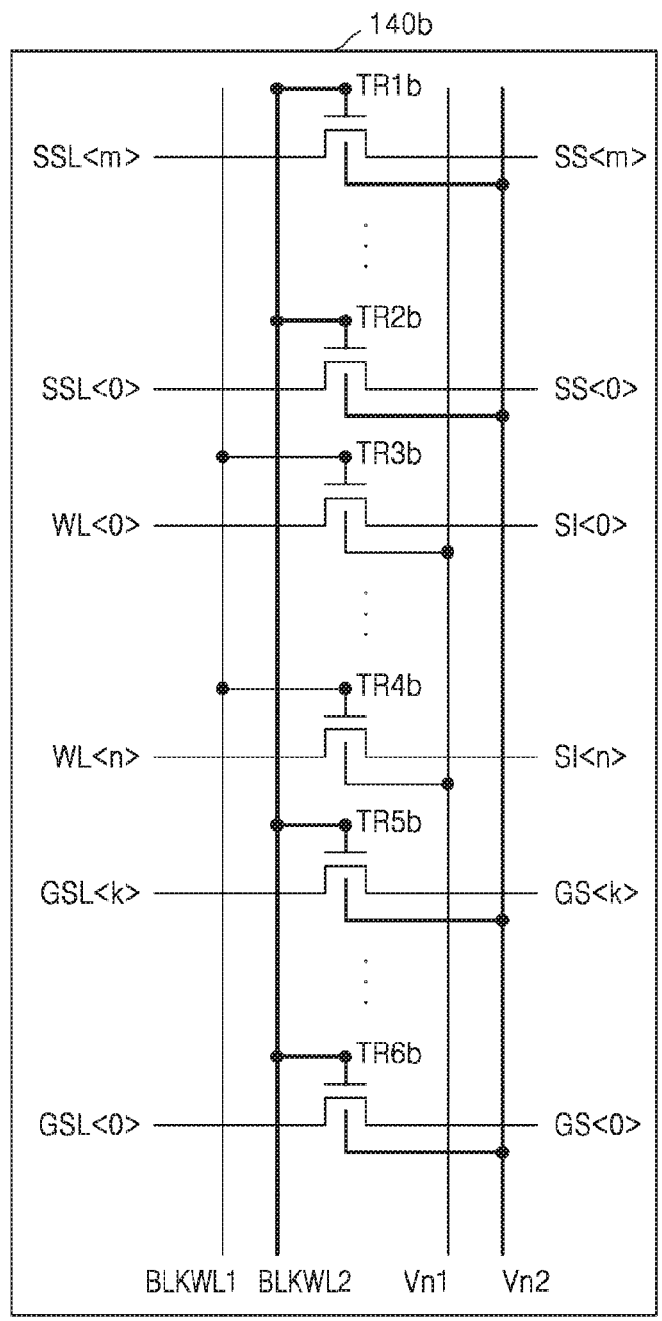
FIG. 30 is a circuit diagram of another example of the row decoder of FIG. 2, according to an exemplary embodiment.

FIG. 30 is a circuit diagram of another example of a row decoder of FIG. 2, according to an exemplary embodiment.

Referring to FIG. 30, a row decoder 140b may include string selection line pass transistors TR1b and TR2b, word line pass transistors TR3b and TR4b, and ground selection line pass transistors TR5b and TR6b. According to the present exemplary embodiment, the word line pass transistors TR3b and TR4b may be located in a first well, and the string selection line pass transistors TR1b and TR2b and the ground selection line pass transistors TR5b and TR6b may be located in a second well. According to the present exemplary embodiment, a first voltage Vn1 is applied to the first well, and a second voltage Vn2 is applied to the second well. The first voltage Vn1 may be different from the second voltage Vn2.

Also, according to the present exemplary embodiment, a first block word line voltage BLKWL1 may be applied to respective gates of the word line pass transistors TR3b and TR4b, and a second block word line voltage BLKWL2 may be applied to respective gates of the string selection line pass transistors TR1b and TR2b and the ground selection line pass transistors TR5b and TR6b. The first block word line voltage BLKWL1 may be different from the second block word line voltage BLKWL2.

According to an exemplary embodiment, while performing a program operation, to apply a program voltage (e.g., 25V) to a word line WL, the first block word line voltage BLKWL1 may be about 30V. The second block word line voltage BLKWL2 may be lower than the first block word line voltage BLKWL1. As a result, deterioration of the string selection line pass transistors TR1b and TR2b and the ground selection line pass transistors TR5b and TR6b may be prevented, and thus, the string selection line pass transistors TR1b and TR2b and the ground selection line pass transistors TR5b and TR6b are protected. Furthermore, metal routing may also be protected. Thus, the problem stated with reference to FIG. 28C may be addressed or solved.

Figure 31:
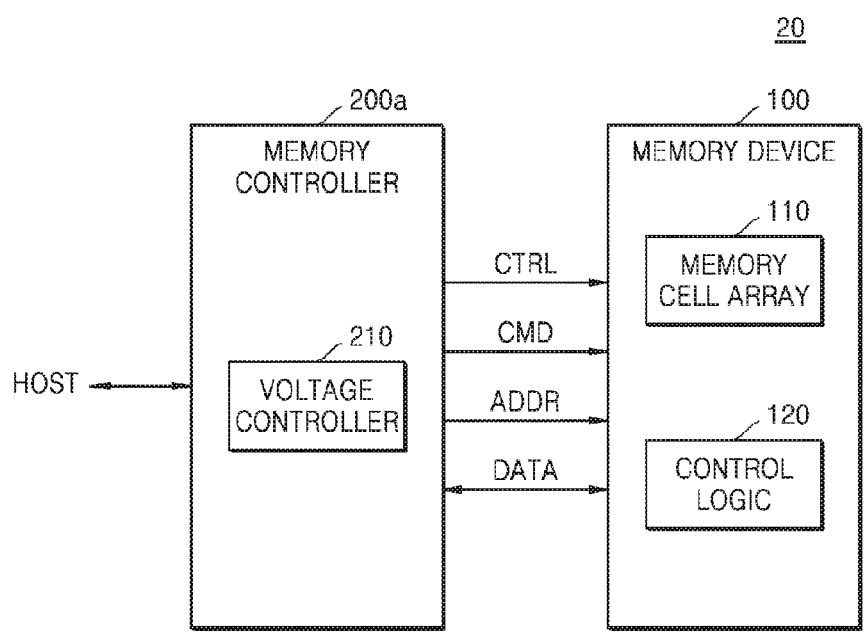
FIG. 31 is a schematic block diagram of a memory system according to an exemplary embodiment.

FIG. 31 is a schematic block diagram of a memory system 20 according to an exemplary embodiment.

Referring to FIG. 31, the memory system 20 may include a memory device 100 and a memory controller 200a. The memory device 100 may include a memory cell array 110 and a control logic 120. The memory device 100 according to the present exemplary embodiment may be substantially similar to the memory device 100 of FIG. 1. Descriptions of features that are already described with reference to FIGS. 1 to 30 and applied to the present exemplary embodiment will not be repeated.

The memory controller 200a may include a voltage controller 210. The voltage controller 210 may control a string selection line voltage or a ground selection line voltage applied to the memory cell array 110. According to the present exemplary embodiment, the voltage controller 210 may generate a voltage control signal that adjusts the string selection line voltage or the ground selection line voltage such that the string selection line voltage or the ground selection line voltage has a negative level in at least a portion of a program section for performing a program operation related to the memory cell array 110. In this case, the memory controller 200a may transmit the voltage control signal to the memory device 100 via a command, an address, data or a control signal.

According to an exemplary embodiment, the voltage controller 210 may generate a voltage control signal that adjusts the string selection line voltage or the ground selection line voltage such that the string selection line voltage or the ground selection line voltage has a negative level in at least a portion of a read section during which a read operation related to the memory cell array 110 is performed. In this case, the memory controller 200a may transmit the voltage control signal to the memory device 100 via a command, an address, data or a control signal.

According to an exemplary embodiment, the voltage controller 210 may generate a voltage control signal that adjusts the string selection line voltage or the ground selection line voltage such that the string selection line voltage or the ground selection line voltage changes according to a loop count. For example, the voltage controller 210 may generate the voltage control signal such that the string selection line voltage or the ground selection line voltage has a negative level when the loop count increases. As another example, the voltage controller 210 may generate the voltage control signal such that the string selection line voltage or the ground selection line voltage changes when the loop count increases.

According to an exemplary embodiment, the voltage controller 210 may generate a voltage control signal that adjusts the string selection line voltage or the ground selection line voltage such that the string selection line voltage or the ground selection line voltage changes according to an operation cycle count. For example, the voltage controller 210 may generate a voltage control signal that adjusts the string selection line voltage or the ground selection line voltage such that the string selection line voltage or the ground selection line voltage changes according to a threshold voltage of a dummy cell, a string selection transistor, or a ground selection transistor in a string.

According to an exemplary embodiment, the voltage controller 210 may generate a voltage control signal that adjusts the string selection line voltage or the ground selection line voltage such that the string selection line voltage or the ground selection line voltage changes according to temperature. In an exemplary embodiment, the voltage controller 210 may generate the voltage control signal such that the string selection line voltage or the ground selection line voltage increases when the temperature decreases.

According to an exemplary embodiment, the voltage controller 210 may generate a voltage control signal that adjusts the string selection line voltage or the ground selection line voltage such that the string selection line voltage or the ground selection line voltage changes according to a location of a selected word line. For example, when the location of the selected word line is near a lower edge of a string, the voltage controller 210 may generate the voltage control signal such that the ground selection line voltage has a negative level. As another example, when the location of the selected word line is near an upper edge of the string, the voltage controller 210 may generate the voltage control signal such that the string selection line voltage has a negative level.

Figure 32:
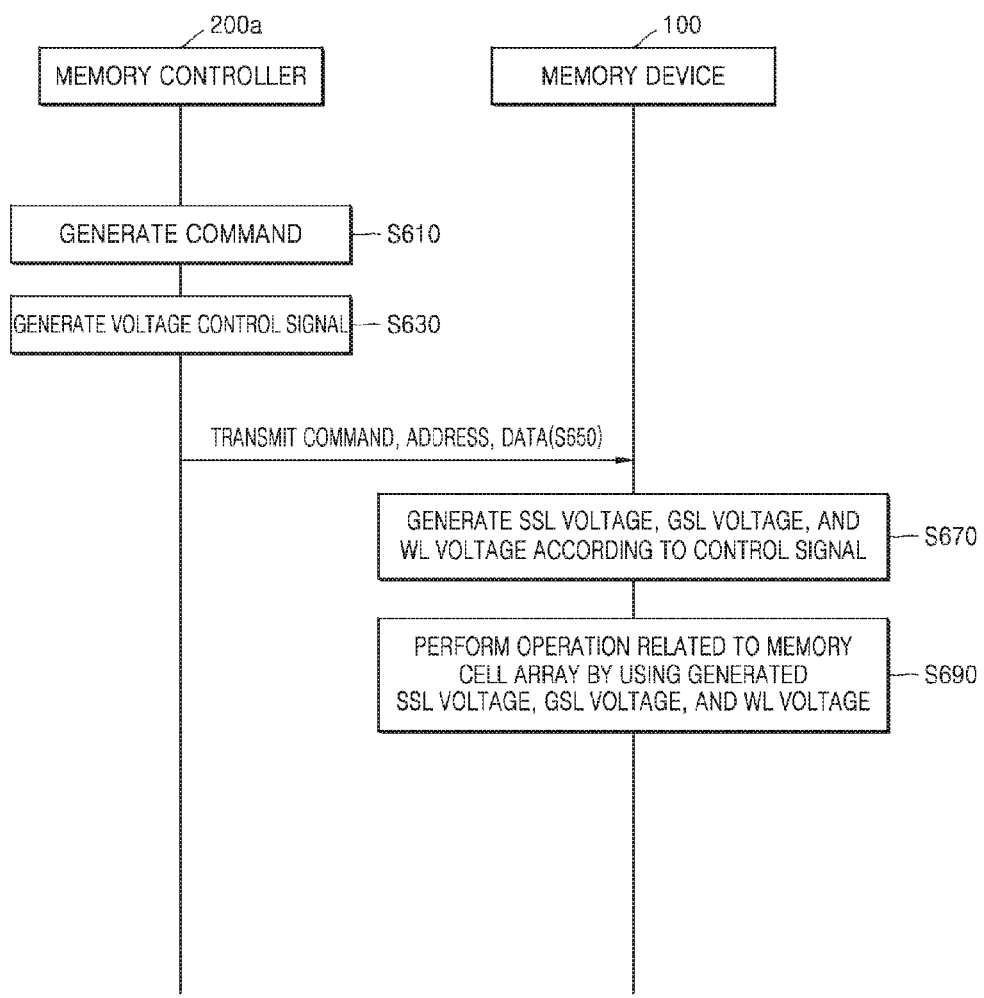
FIG. 32 is a flowchart of operations of a memory controller and a memory device, according to an exemplary embodiment.

FIG. 32 is a flowchart of operations of the memory controller 200a and the memory device 100, according to an exemplary embodiment.

Referring to FIG. 32, in operation S610, the memory controller 200a may generate a command According to an exemplary embodiment, the command may include a program command. According to an exemplary embodiment, the command may include a read command. In operation S630, the memory controller 200a generates a voltage control signal. In an exemplary embodiment, the memory controller 200a may generate a voltage control signal that adjusts the string selection line voltage or the ground selection line voltage such that the string selection line voltage or the ground selection line voltage has a negative level in at least a portion of the program section.

In operation S650, the memory controller 200a transmits a command, an address, data, or a control signal to the memory device 100. The determined voltage control signal may be transmitted to the memory device 100 via the command, the address, the data, or the control signal. In operation S670, the memory device 100 may generate a string selection line voltage, a ground selection line voltage, and a word line voltage according to the received control signal. In operation S690, the memory device 100 performs an operation related to the memory cell array 110 by using the generated string selection line voltage, ground selection line voltage, and word line voltage. According to an exemplary embodiment, in operation S690, the program operation related to the memory cell array 110 may be performed. According to an exemplary embodiment, in operation S690, a read operation related to the memory cell array 110 may be performed.

Figure 33:
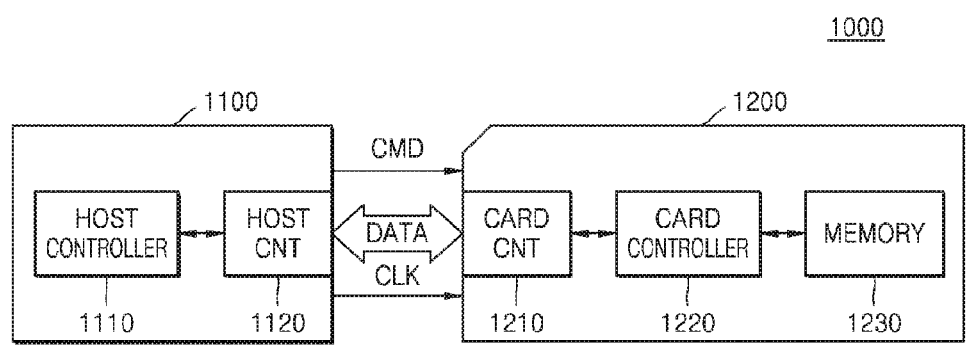
FIG. 33 is a block diagram of an example in which a memory device according to exemplary embodiments is applied to a memory card system.

FIG. 33 is a block diagram of an example in which a memory device according to exemplary embodiments is applied to a memory card system 1000.

Referring to FIG. 33, the memory card system 1000 may include a host 1100 and a memory card 1200. The host 1100 may include a host controller 1110 and a host connector 1120. The memory card 1200 may include a card connector 1210, a card controller 1220, and a memory 1220. The memory card 1200 may be provided by using the exemplary embodiments shown in FIGS. 1 to 32.

The host 1100 may write data to the memory card 1200 or read data stored in the memory card 1200. The host controller 1110 may transmit a command CMD, a clock signal CLK generated in a clock generator (not shown) in the host 1100, and DATA to the memory card 1200 via the host connector 1120.

In response to the command CMD received via the card connector 1210, the card controller 1220 may synchronize the DATA with the clock signal CLK generated by the clock generator in the card controller 1220 and store the DATA in the memory 1220. The memory 1220 may store the DATA transmitted from the host 1100.

The memory card 1200 may include a compact flash card (CFC), a microdrive, a smart media card (SMC), a multimedia card (MMC), a security digital card (SDC), a Memory Stick, a USB flash memory driver, etc.

Figure 34:
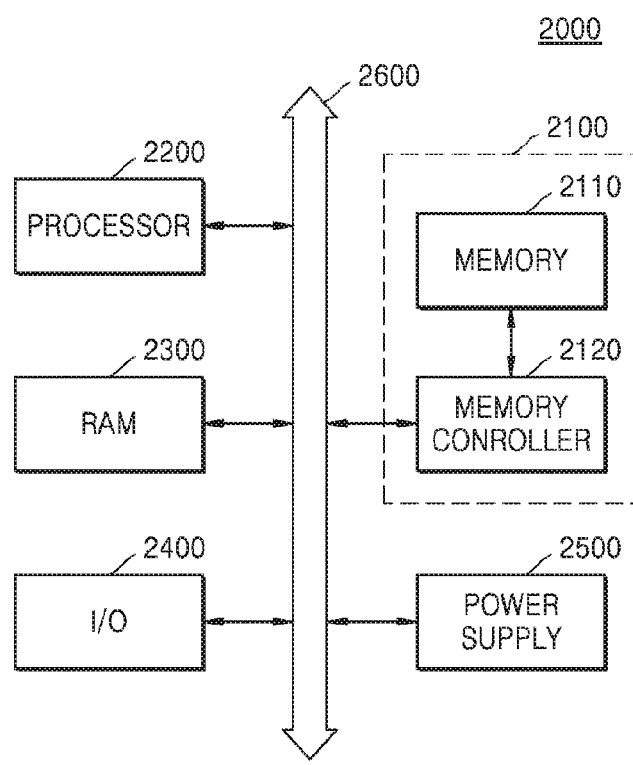
FIG. 34 is a block diagram of an example in which a memory device according to exemplary embodiments is applied to a computing system.

FIG. 34 is a block diagram of an example in which a memory device according to exemplary embodiments is applied to a computing system 2000.

Referring to FIG. 34, the computing system 2000 includes a memory system 2100, a processor 2200, a RAM 2300, an I/O device 2400, and a power supply 2500. Although not illustrated in FIG. 34, the computing system 2000 may further include ports that may communicate with a video card, a sound card, a memory card, a USB device, or other electronic devices. The computing system 2000 may include a personal computer or a portable electronic device such as a laptop computer, a mobile phone, a personal digital assistant (PDA), or a camera.

The processor 2200 may perform certain computations and tasks. According to exemplary embodiments, the processor 2200 may include a microprocessor or a central processing unit (CPU). The processor 2200 may communicate with the RAM 2300, the I/O device 2400, and a memory system 2100 via a bus 2600 such as an address bus, a control bus, and a data bus. According to exemplary embodiments, the processor 2200 may be to an expansion bus such as a Peripheral Component Interconnect (PCI) bus.

The memory system 2100 may be provided by using the exemplary embodiments shown in FIGS. 1 to 33. In an exemplary embodiment, a memory 2110 may divide blocks in a cell area into at least two block areas, and control operations of each block area by using operation parameters that respectively correspond to the block areas.

The RAM 2300 may store data required for operations of the computing system 2000. For example, the RAM 2300 may include DRAM, mobile DRAM, SRAM, PRAM, FRAM, RRAM, and/or MRAM. The I/O device 2400 may include an input device such as a keyboard, a keypad, or a mouse, and an output device such as a printer or a display. The power supply 2500 may supply an operation voltage for the operations of the computing system 2000.

Figure 35:
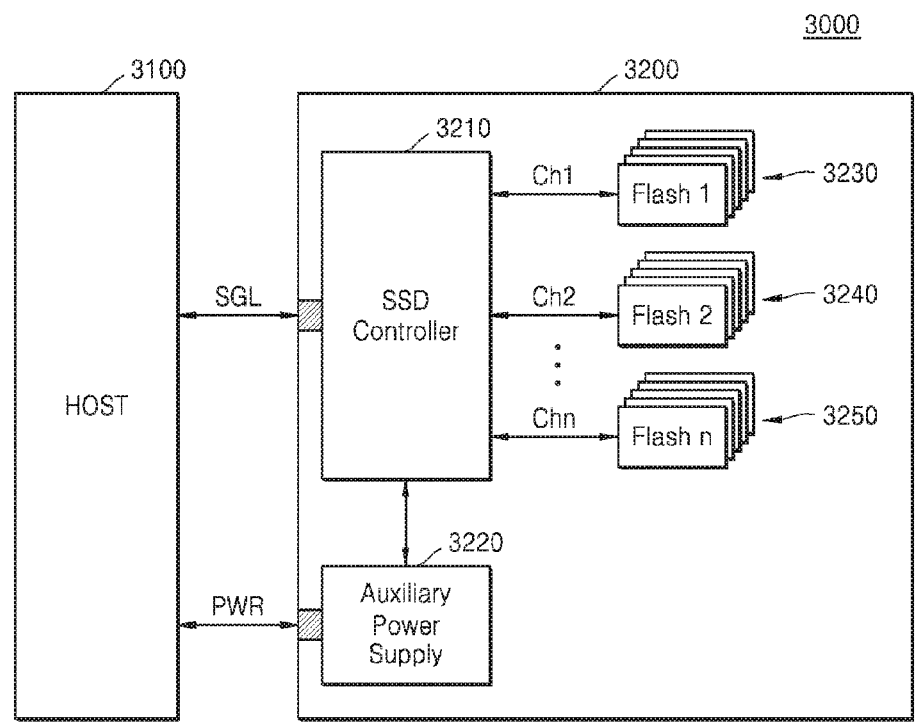
FIG. 35 is a block diagram of an example in which a memory device according to exemplary embodiments is applied to a solid state drive (SSD) system.

FIG. 35 is a block diagram of an example in which a memory device according to exemplary embodiments is applied to a solid state drive (SSD) system 3000.

Referring to FIG. 35, the SSD system 3000 may include a host 3100 and an SSD 3200. The SSD 3200 transceives signals with the host 3100 via a signal connector, and receives power via a power connector. The SSD 3200 may include an SSD controller 3210, an auxiliary power supply 3220, and a plurality of memory devices 3230, 3240, and 3250. The SSD 3200 may be provided by using the exemplary embodiments shown in FIGS. 1 to 34. In an exemplary embodiment, flash memories 3230 to 3250 may divide blocks in a cell area into at least two block areas, and control operations of each block area by using operation parameters that respectively correspond to the block areas.

Figure 36:
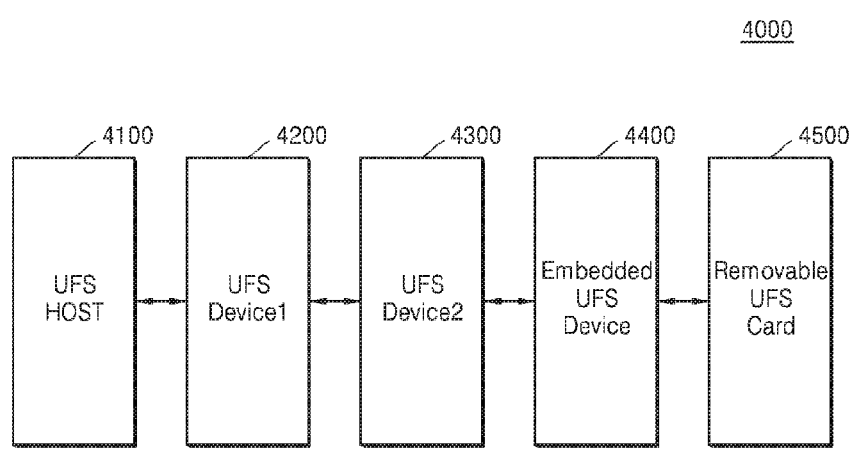
FIG. 36 is a block diagram of an example in which a memory device according to exemplary embodiments is applied to a universal flash storage (UFS).

FIG. 36 is a block diagram of an example in which a memory device according to exemplary embodiments is applied to a universal flash storage (UFS) 4000.

Referring to FIG. 36, the UFS system 4000 may include a UFS host 4100, UFS devices 4200 and 4300, an embedded UFS device 4400, and a removable UFS card 4500. The UFS host 4100 may be an application processor of a mobile device. The UFS host 4100, the UFS devices 4200 and 4300, the embedded UFS device 4400, and the removable UFS card 4500 may communicate with external devices over a UFS protocol. At least one of the UFS devices 4200 and 4300, the embedded UFS device 4400, and the removable UFS card 4500 may include the memory device 100 shown in FIGS. 1 to 32.

The embedded UFS device 4400 and the removable UFS card 4500 may communicate over protocols other than the UFS protocol. The UFS host 4100 and the removable UFS card 4500 may communicate over various card protocols (e.g., UFDs, MMC, SD, mini SD, Micro SD, etc.).

A memory card, a non-volatile memory device, and a card controller according to the exemplary embodiments may be formed or embodied by using various packages. For example, a flash memory device and/or a memory controller according to the exemplary embodiments may be formed or embodied by using packages such as Package on Package (PoP), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flat pack (TQFP), a Small Outline (SOIC), a Shrink Small Outline Package (SSOP), a Thin Small Outline (TSOP), a System In Package (SIP), a Multi Chip Package (MCP), a Wafer-level Fabricated Package (WFP), and a Wafer-Level Processed Stack Package (WSP).

While the inventive concept has been particularly shown and described with reference to exemplary embodiments thereof, it will be understood that various changes in form and details may be made therein without departing from the spirit and scope of the following claims.

What is claimed is:

1. A memory device comprising:
   a memory cell array including a plurality of NAND strings, wherein each of the NAND strings includes a ground selection transistor connected to a ground selection line, memory cells connected to word lines, and a string selection transistor connected to a string selection line, wherein the ground selection line, the word lines, and the string selection line are vertically stacked on a substrate; and
   a control logic configured to adjust a ground selection line voltage applied to the ground selection line or a string selection line voltage applied to the string selection line to a negative level in at least a portion of a program section during which a program operation related to a memory cell selected from among the memory cells is performed.

2. The memory device of claim 1, wherein the control logic is configured to change the ground selection line voltage or the string selection line voltage according to a program loop count or a program voltage applied to a selected word line connected to the selected memory cell.

3. The memory device of claim 2, wherein the control logic is configured to adjust the ground selection line voltage or the string selection line voltage to the negative level in at least some program loops from among a plurality of program loops corresponding to the program section.

4. The memory device of claim 1, wherein the control logic is configured to change the ground selection line voltage or the string selection line voltage according to an operation cycle count.

5. The memory device of claim 4, wherein the control logic is configured to adjust the ground selection line voltage or the string selection line voltage when the operation cycle count is the same as or greater than a threshold value.

6. The memory device of claim 1, wherein the control logic is configured to change the ground selection line voltage or the string selection line voltage based on a number of fail bits in the memory cells or a threshold value of the ground selection transistor or the string selection transistor.

7. The memory device of claim 1, wherein the control logic is configured to change the ground selection line voltage or the string selection line voltage according to a location of the selected memory cell or a temperature.

8. The memory device of claim 1, wherein at least one of the NAND strings includes a plurality of ground selection transistors respectively connected to a plurality of ground selection lines or includes a plurality of string selection transistors respectively connected to a plurality of string selection lines; and wherein the control logic is configured to adjust a voltage applied to at least one of the ground selection lines or a voltage applied to at least one of the string selection lines to a negative level, in at least a portion of the program section.

9. The memory device of claim 1, wherein the memory cell array includes a lower block on the substrate and an upper block on the lower block; and wherein the control logic is configured to adjust a voltage applied to a ground selection line or a string selection line, included in at least one of the lower block and the upper block, to the negative level.

10. The memory device of claim 1, further comprising a peripheral circuit on the substrate; wherein the memory cell array is located over the peripheral circuit or over an insulating layer on the substrate.

11. The memory device of claim 1, wherein the control logic is configured to adjust the ground selection line voltage or the string selection line voltage to a negative level in at least a portion of a read section during which a read operation related to the selected memory cell is performed.

12. A memory device comprising:
a memory cell array including a plurality of NAND strings, wherein each of the NAND strings includes a ground selection transistor, a plurality of memory cells, and a string selection transistor vertically stacked on a substrate; and
a row decoder connected to the memory cell array via a ground selection line, word lines, and a string selection line, and including at least one word line pass transistor located in a first well, and at least one ground selection line pass transistor and at least one string selection line pass transistor located in a second well.

13. The memory device of claim 12, wherein the row decoder is configured to apply a negative voltage to the ground selection line or the string selection line in at least a portion of a program section during which a program operation related to a memory cell selected from among the memory cells is performed.

14. The memory device of claim 13, wherein when performing the program operation related to the memory cell selected from among the memory cells, a first well voltage applied to the first well is different from a second well voltage applied to the second well.

15. The memory device of claim 12, wherein the row decoder is configured to apply a negative voltage to the ground selection line or the string selection line in at least a portion of a read section during which a read operation related to the selected memory cell is performed.

16. The memory device of claim 15, wherein when performing the read operation related to the memory cell selected from among the memory cells, a first well voltage applied to the first well is different from a second well voltage applied to the second well.

17. The memory device of claim 12, wherein a first gate voltage applied to the word line pass transistor is different from a second gate voltage applied to the ground selection line pass transistor.

18. The memory device of claim 12, wherein a first gate voltage applied to the word line pass transistor is different from a second gate voltage applied to the string selection line pass transistor.

19. The memory device of claim 12, further comprising a control logic coupled to the row decoder and configured to adjust a ground selection line voltage applied to the ground selection line or a string selection line voltage applied to the string selection line to a negative level in at least a portion of a program section during which a program operation related to a memory cell selected from among the memory cells is performed.

20. The memory device of claim 19, wherein the control logic is configured to change the ground selection line voltage or the string selection line voltage according to a program loop count or a program voltage applied to a selected word line connected to the selected memory cell.

* * * * *